US012653012B2

(12) United States Patent
Shigetoshi et al.

(10) Patent No.: US 12,653,012 B2
(45) Date of Patent: Jun. 9, 2026

(54) SEMICONDUCTOR DEVICE WITH THROUGH HOLE ELECTRODE WIRING

(71) Applicant: SONY SEMICONDUCTOR SOLUTIONS CORPORATION, Kanagawa (JP)

(72) Inventors: Takushi Shigetoshi, Kanagawa (JP); Yoshiaki Yanagawa, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 276 days.

(21) Appl. No.: 18/260,669

(22) PCT Filed: Jan. 17, 2022

(86) PCT No.: PCT/JP2022/001277
§ 371 (c)(1),
(2) Date: Jul. 7, 2023

(87) PCT Pub. No.: WO2022/158408
PCT Pub. Date: Jul. 28, 2022

(65) Prior Publication Data
US 2024/0055326 A1 Feb. 15, 2024

(30) Foreign Application Priority Data
Jan. 19, 2021 (JP) ................................. 2021-006292

(51) Int. Cl.
*H10W 20/20* (2026.01)
*H10F 39/12* (2025.01)
(Continued)

(52) U.S. Cl.
CPC ......... *H10W 20/20* (2026.01); *H10W 20/023* (2026.01); *H10W 20/42* (2026.01);
(Continued)

(58) Field of Classification Search
CPC ............. H01L 23/481; H01L 21/76898; H01L 23/5226; H01L 24/05; H01L 24/13;
(Continued)

(56) References Cited

U.S. PATENT DOCUMENTS

| | | | | |
|---|---|---|---|---|
| 6,501,663 | B1 | 12/2002 | Pan | |
| 2005/0070050 | A1 | 3/2005 | Murakami | |
| 2007/0096330 | A1* | 5/2007 | Shizuno | ............... H10D 62/117 |
| | | | | 257/E29.022 |

(Continued)

FOREIGN PATENT DOCUMENTS

| | | |
|---|---|---|
| JP | H08-162459 | 6/1996 |
| JP | 2005-123569 | 5/2005 |

(Continued)

OTHER PUBLICATIONS

International Search Report and Written Opinion prepared by the Japan Patent Office on Mar. 1, 2022, for International Application No. PCT/JP2022/001277, 3 pgs.

*Primary Examiner* — Herve-Louis Y Assouman
(74) *Attorney, Agent, or Firm* — SHERIDAN ROSS P.C.

(57) ABSTRACT

In a semiconductor device provided with a through electrode, thermal stress is reduced. The semiconductor device includes a semiconductor substrate, a wiring layer, a first through hole, and a first inner through electrode. In the semiconductor device, the wiring layer is formed on a front surface of the semiconductor substrate. Furthermore, in the semiconductor device, the first through hole penetrates the semiconductor substrate from a back surface to the front surface of the semiconductor substrate, and has a side wall covered with an insulating film. Furthermore, in the semiconductor device, the first inner through electrode is formed along a part of the side wall of the first through hole.

20 Claims, 32 Drawing Sheets

(51) Int. Cl.

| | |
|---|---|
| *H10W 20/00* | (2026.01) |
| *H10W 20/42* | (2026.01) |
| *H10W 70/65* | (2026.01) |
| *H10W 72/20* | (2026.01) |
| *H10W 72/90* | (2026.01) |

(52) U.S. Cl.
CPC ............ *H10W 72/90* (2026.01); *H10W 70/65* (2026.01); *H10W 72/20* (2026.01)

(58) Field of Classification Search
CPC ....... H01L 2224/02371; H01L 2224/13; H01L 2224/02375; H01L 2224/0401; H01L 2224/05555; H01L 2224/02372; H10F 39/12
See application file for complete search history.

(56) References Cited

U.S. PATENT DOCUMENTS

| | | | | |
|---|---|---|---|---|
| 2008/0299768 | A1* | 12/2008 | Yamano ............ | H01L 21/76898 257/E21.597 |
| 2011/0101539 | A1 | 5/2011 | Kato | |
| 2020/0235038 | A1* | 7/2020 | Adusumilli ........ | G02B 6/12002 |
| 2021/0087053 | A1* | 3/2021 | Weidner ................. | H01L 24/03 |

FOREIGN PATENT DOCUMENTS

| | | |
|---|---|---|
| JP | 2007-103521 | 4/2007 |
| JP | 2010-045162 | 2/2010 |
| JP | 2011-096918 | 5/2011 |
| JP | 2013-041914 | 2/2013 |
| JP | 2013-187224 | 9/2013 |

* cited by examiner a b c a b a b c a b c a b c a b a b a b c a b c a b c a b c a b a b c d

Figure 31:
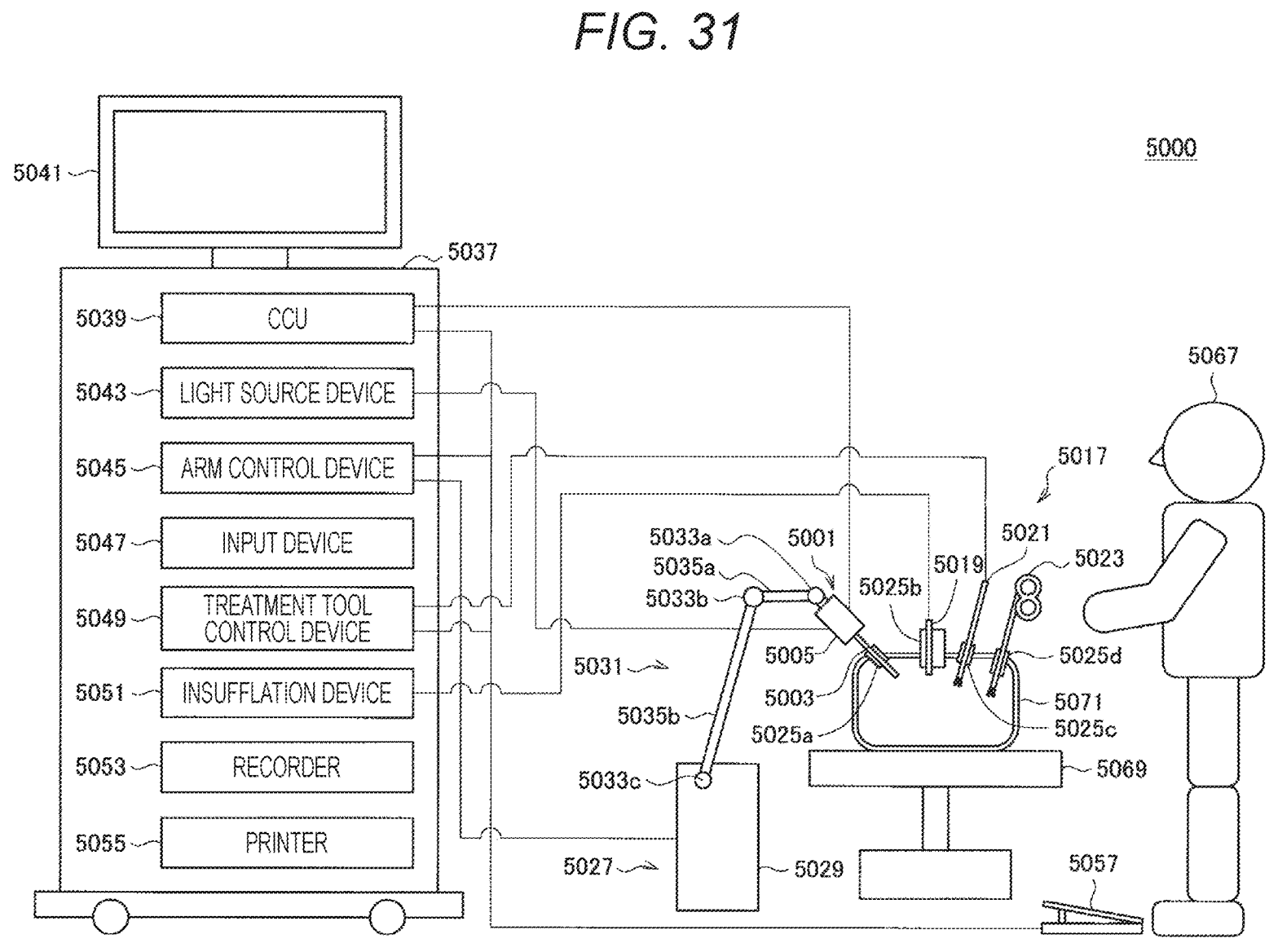

CCU 5039

LIGHT SOURCE DEVICE 5043

ARM CONTROL DEVICE 5045

INPUT DEVICE 5047

TREATMENT TOOL CONTROL DEVICE 5049

INSUFFLATION DEVICE 5051

RECORDER 5053

PRINTER 5055

SEMICONDUCTOR DEVICE WITH THROUGH HOLE ELECTRODE WIRING

CROSS REFERENCE TO RELATED APPLICATIONS

This application is a national stage application under 35 U.S.C. 371 and claims the benefit of PCT Application No. PCT/JP2022/001277, having an international filing date of 17 Jan. 2022, which designated the United States, which PCT application claimed the benefit of Japanese Patent Application No. 2021-006292, filed 19 Jan. 2021, the entire disclosures of each of which are incorporated herein by reference.

TECHNICAL FIELD

The present technology relates to a semiconductor device. Specifically, the present technology relates to a semiconductor device for which three-dimensional mounting is performed, and a method for manufacturing a semiconductor device.

BACKGROUND ART

Conventionally, in a semiconductor device, a through electrode may be used embedded in a through hole of a semiconductor substrate with an insulating film interposed therebetween. This through electrode is generally larger in size than a front surface wiring line wired on a front surface of a semiconductor substrate, and furthermore, the semiconductor substrate and the through electrode have different coefficients of thermal expansion (CTE). For this reason, a large thermal stress (stress) may be generated around the through electrode. Due to this thermal stress, there is a possibility that characteristics of the peripheral semiconductor elements fluctuate. Furthermore, there is a possibility that a crack of the insulating film in the through hole, peeling between the through electrode and a pad, or the like occurs due to the thermal stress accompanying a temperature cycle. To solve these problems, there has been devised a semiconductor device in which a through electrode is formed into a cup shape, its inside is filled with a protective film, and at that time, is not completely filled but a gap is left (See, for example, Patent Document 1.).

CITATION LIST

Patent Document
Patent Document 1: Japanese Patent Application Laid-Open No. 2010-45162

SUMMARY OF THE INVENTION

Problems to be Solved by the Invention

In the above-described conventional technology, when the through electrode is formed into the cup shape and the inside is filled, the gap is left to reduce the thermal stress. However, even in the above-described semiconductor device, reduction of the thermal stress may be insufficient, and in that case, it is difficult to further reduce the thermal stress.

The present technology has been made in view of such a situation, and an object thereof is to reduce the thermal stress in a semiconductor device provided with a through electrode.

Solutions to Problems

The present technology has been made to solve the above-described problems, and a first aspect thereof is a semiconductor device including: a semiconductor substrate; a wiring layer formed on a front surface of the semiconductor substrate; a first through hole that penetrates the semiconductor substrate from a back surface to the front surface of the semiconductor substrate, and has a side wall covered with an insulating film; and a first inner through electrode formed along a part of the side wall of the first through hole, and a method for manufacturing the semiconductor device. This brings about an effect that thermal stress is reduced.

Furthermore, in the first aspect, a second through hole that penetrates the semiconductor substrate from the back surface to the front surface of the semiconductor substrate, and has a side wall covered with an insulating film, and a second inner through electrode formed along the side wall of the second through hole may be further included, in which an area where the second inner through electrode is formed may be different from an area where the first inner through electrode is formed. This brings about an effect that thermal stress and resistivity are adjusted to appropriate values for each through electrode.

Furthermore, in the first aspect, an outer through electrode formed between the semiconductor substrate and the insulating film may be further included. This brings about an effect that crosstalk is reduced.

Furthermore, in the first aspect, an external terminal formed on the back surface, and a back surface wiring line having one end connected to the external terminal and another end connected to the first inner through electrode may be further included. This brings about an effect that a signal is transmitted to and from the outside.

Furthermore, in the first aspect, a predetermined number of semiconductor elements may be arranged in the wiring layer, a specific semiconductor element among the predetermined number of semiconductor elements may be closest to the first through hole, and the first inner through electrode may be disposed at a position closest to the specific semiconductor element in the first through hole.

Furthermore, in the first aspect, a predetermined number of semiconductor elements may be arranged in the wiring layer, a specific semiconductor element among the predetermined number of semiconductor elements may be closest to the first through hole, and the first inner through electrode may be disposed at a position farthest from the specific semiconductor element in the first through hole. This brings about an effect that characteristic fluctuation of the semiconductor element due to thermal stress is reduced.

Furthermore, in the first aspect, the first inner through electrode may be formed at each of a plurality of places of the side wall of the first through hole. This brings about an effect that a plurality of back surface wiring lines is wired.

Furthermore, in the first aspect, potentials of the first inner through electrodes at the plurality of places may be identical to each other. This brings about an effect that the thermal stress is further reduced.

Furthermore, in the first aspect, potentials of the first through electrodes at the plurality of places may be different from each other. This brings about an effect that high integration becomes possible.

Furthermore, in the first aspect, a back surface wiring line connected to the first inner through electrode may be further included, in which the first inner through electrode and the back surface wiring line may be different from each other in at least one of a line width or a thickness. This brings about an effect that a degree of freedom in design is improved and signal transmission performance is improved.

Furthermore, in the first aspect, a shape of the through hole may be an ellipse when viewed from a direction perpendicular to the back surface, and the first inner through electrode may be formed on a minor axis of the ellipse. This brings about an effect that manufacturing is facilitated.

Furthermore, in the first aspect, the first inner through electrode may be formed along a part of the side wall and a part of a bottom portion of the first through hole. This brings about an effect that thermal stress is reduced.

Furthermore, in the first aspect, a pad may be formed along a part of the bottom portion in the wiring layer. This brings about an effect that the first inner through electrode is connected to the wiring layer.

Furthermore, in the first aspect, the first inner through electrode may be formed in a portion other than a slit. This brings about an effect that the area of the first inner through electrode is increased.

Furthermore, in the first aspect, the insulating film may cover a part of the side wall of the through hole, and the first inner through electrode may be formed along the side wall covered with the insulating film. This brings about an effect that heat stress is reduced.

Furthermore, in the first aspect, an inorganic film that covers the side wall of the through hole may be further included, in which the insulating film may cover a part of the inorganic film. This brings about an effect that a portion not covered with the insulating film is covered with the inorganic film.

Furthermore, in the first aspect, the insulating film may cover a plurality of regions of the side wall of the through hole. This brings about an effect that it becomes possible to cope with various layouts of conductive films and through holes.

Furthermore, in the first aspect, an area of a portion covered with the insulating film of the side wall may be different from an area of a portion not covered with the insulating film. This brings about an effect that it becomes possible to cope with various layouts of conductive films and through holes.

BRIEF DESCRIPTION OF DRAWINGS

FIG. 29 is a block diagram illustrating an example of a schematic configuration of a vehicle control system.

FIG. 31 is a diagram illustrating an example of a schematic configuration of an endoscopic surgical system.

MODE FOR CARRYING OUT THE INVENTION

The following is a description of a mode for carrying out the present technology (the mode will be hereinafter referred to as the embodiment). The description will be made in the following order.

1. First embodiment (example of forming through electrode on part of side wall of through hole)
  2. Second embodiment (example of forming plurality of through electrodes having different areas)
  3. Third embodiment (example in which through electrode is formed on part of side wall of through hole and part of side wall of through hole)
  4. Fourth embodiment (example of forming through electrode on part of inner wall of insulating film by changing layout)
  5. Fifth embodiment (example in which plurality of through electrodes having same potentials are formed on part of side wall of through hole)
  6. Sixth embodiment (example in which plurality of through electrodes having different potentials are formed on part of side wall of through hole)
  7. Seventh embodiment (example in which through electrode is formed on part of side wall of through hole, and connected to back surface wiring lines having different line widths and thicknesses)
  8. Eighth embodiment (example of forming through electrode on part of side wall of elliptical through hole)
  9. Ninth embodiment (example of forming through electrode in portion other than slit portion)
  10. Tenth embodiment (example in which part of side wall of through hole is covered with insulating film to form through electrode)
  11. Application example to mobile body
  12. Application example to endoscopic surgical system 1. First Embodiment

[Configuration Example of Semiconductor Device]

Figure 1:
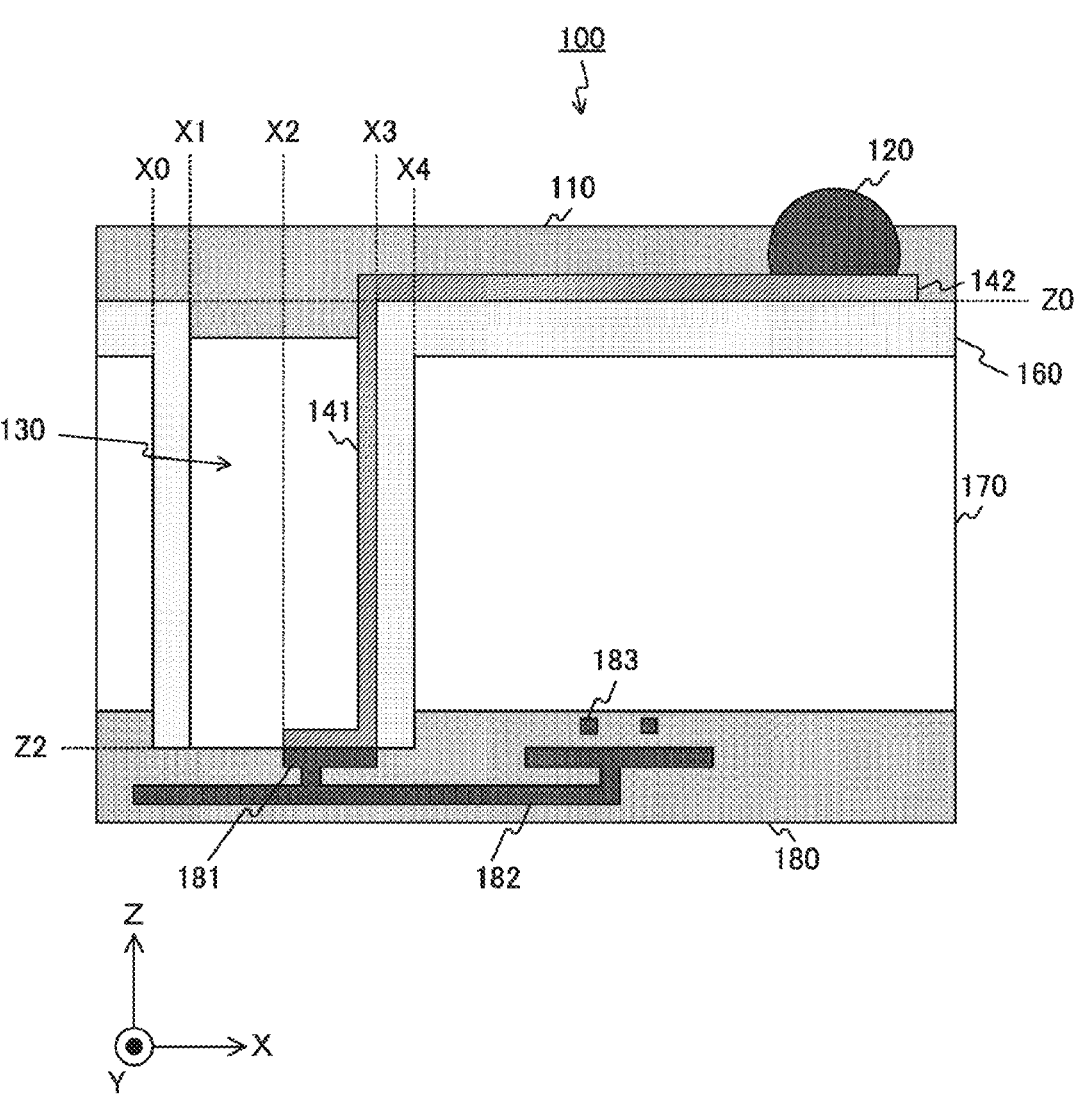
FIG. 1 is a cross-sectional view illustrating a configuration example of a semiconductor device in a first embodiment of the present technology.

FIG. 1 is a cross-sectional view illustrating a configuration example of a semiconductor device 100 in a first embodiment of the present technology. The semiconductor device 100 includes a protective film 110, a bump 120, a through electrode 141, a back surface wiring line 142, an insulating film 160, a semiconductor substrate 170, and a wiring layer 180. As the semiconductor device 100, various circuits, elements, and devices such as a signal processing circuit, a memory, and an image sensor are assumed.

Hereinafter, of both surfaces of the semiconductor substrate 170, a surface on which the wiring layer 180 is formed is referred to as a "front surface", and a surface facing the front surface is referred to as a "back surface". Furthermore, an axis perpendicular to the front surface of the semiconductor substrate 170 is set as a Z axis, and a predetermined axis parallel to the front surface is set as an X axis. An axis perpendicular to the X-axis and the Z-axis is set as a Y-axis. The figure is a cross-sectional view of the semiconductor device 100 when viewed from the Y-axis direction.

In the semiconductor substrate 170, a through hole 130 is formed reaching from the back surface to the front surface of the semiconductor substrate 170 along the Z-axis direction. A side wall of the through hole 130 and the back surface of the semiconductor substrate 170 are covered with the insulating film 160. In the figure, a coordinate X0 and a coordinate X4 correspond to positions of an outer wall (in other words, the side wall of the through hole 130 before covering) of the insulating film 160. Furthermore, a coordinate X1 and a coordinate X3 correspond to positions of an inner wall (in other words, the side wall of the through hole 130 after covering) of the insulating film 160. Positions of the side wall of the through hole 130 are different between before covering and after covering, but hereinafter, a position after covering (that is, the inner wall of the insulating film 160) is treated as the side wall of the through hole 130 unless otherwise specified. Furthermore, a portion of the through hole 130 closest to the front surface is referred to as a "bottom portion" of the through hole 130. In the figure, a portion of a coordinate Z2 corresponds to the bottom portion.

As the insulating film 160, an inorganic film, or a resin film having a skeleton of polyimide, acrylic, silicone, or an epoxy group is used. As the inorganic film, silicon dioxide ($SiO_2$), silicon nitride (SiN), silicon monoxide nitride (SiON), a low-k film, or the like is used.

Furthermore, the back surface of the semiconductor substrate 170 is covered with the protective film 110 except for a region serving as a connection portion with the outside. As the protective film 110, a resin film having polyimide, acrylic, silicone, or an epoxy group as a skeleton, or the like is used. For connection with the outside, the bump 120, a pillar of a conductive film, or the like is used. In the through hole 130, a gap is formed surrounded by the protective film 110, the insulating film 160, and the wiring layer 180.

Furthermore, a conductive film is formed as the through electrode 141 along a part of the side wall of the through hole 130 and a part of the bottom portion. The conductive film formed from a coordinate Z0 to the coordinate Z2 in the Z-axis direction of the figure corresponds to the through electrode 141. In the X-axis direction, the conductive film formed from a coordinate X2 to the coordinate X3 corresponds to the through electrode 141. As a material of the conductive film, copper (Cu), titanium (Ti), tantalum (Ta), aluminum (Al), tungsten (W), nickel (Ni), ruthenium (Ru), cobalt (Co), or the like is used.

A ratio of a portion where the through electrode 141 is formed in the side wall of the through hole 130 can be freely changed as necessary, and is preferably 10 to 70 percent (%) of a surface area of the side wall. Note that the through hole 130 is an example of a first through hole described in the claims, and the through electrode 141 is an example of a first inner through electrode described in the claims.

Furthermore, the back surface wiring line 142 is formed on the back surface of the semiconductor substrate 170 by patterning a conductive film. A line width and a thickness of the back surface wiring line 142 are substantially the same as those of the through electrode 141.

Furthermore, one end of the back surface wiring line 142 is connected to the bump 120, and the other end is connected to the through electrode 141. The back surface wiring line 142 may be formed simultaneously using the same material as that of the through electrode 141, or may be formed separately.

Furthermore, in addition to a semiconductor element (not illustrated), a pad 181 and a front surface wiring line 182 are formed in the wiring layer 180. As the semiconductor element, a signal processing circuit, a memory, an image sensor, or the like is used.

The wiring layer 180 is a single layer, and the pad 181 is formed at a portion where the through electrode 141 is disposed in the bottom portion of the through hole 130. As a material of the pad 181, copper (Cu), titanium (Ti), tantalum (Ta), aluminum (Al), tungsten (W), nickel (Ni), ruthenium (Ru), cobalt (Co), or the like is used.

Note that a plurality of wiring layers can also be formed. In this case, the pad 181 can be disposed on a first wiring layer closest to the front surface, or can be disposed on and after a second wiring layer. Furthermore, the pad 181 may be formed in a single wiring layer or may be formed over a plurality of wiring layers.

Furthermore, although the pad 181 is formed in a part of the bottom portion of the through hole 130 in the figure, the pad 181 can be formed on the entire bottom portion. In a case where the pad 181 is formed in a part of the bottom portion, processing cannot be stopped by the pad 181 when the through hole 130 is processed by dry etching, but an area where the pad 181 is exposed can be reduced. For this reason, generation of a metal-based reaction product and charging damage can be improved.

Furthermore, a predetermined number of semiconductor elements such as a transistor 183 are arranged in the wiring layer 180. It is assumed that the transistor 183 among the semiconductor elements in the wiring layer 180 is closest to the through hole 130. Furthermore, in the through hole 130, the through electrode 141 is disposed at a position closest to the transistor 183 (the coordinate X3 at the right end of the through hole 130 in the figure).

Here, a configuration in which the through hole 130 is filled with a conductive film is assumed as a first comparative example. Furthermore, as in Patent Document 1, a configuration in which the entire side wall and the entire bottom portion of the through hole 130 are covered with a conductive film to form a cup shape, and the inside thereof is filled with a protective film while leaving a gap is assumed as a second comparative example.

In the second comparative example of the cup shape, thermal stress (stress) is reduced as compared with the first comparative example, but in particular, strong thermal stress is generated in the circumferential direction and the bottom portion. On the other hand, in the configuration of the figure, since the through electrode 141 is formed only on a part of the side wall and the bottom portion of the through hole 130, the thermal stress can be reduced as compared with the second comparative example.

Furthermore, in the first and second comparative examples, wiring characteristics of the through electrode depend on a diameter of the through electrode and a thickness of the conductive film. On the other hand, in the configuration of the figure, since the through electrode 141 is formed only on a part of the side wall and the bottom portion of the through hole 130, the wiring characteristics can be controlled independently of the diameter of the through electrode. As a result, impedance matching with the back surface wiring line 142 and the like can be easily performed, and transmission characteristics of a high-frequency signal can be improved.

Figure 2:
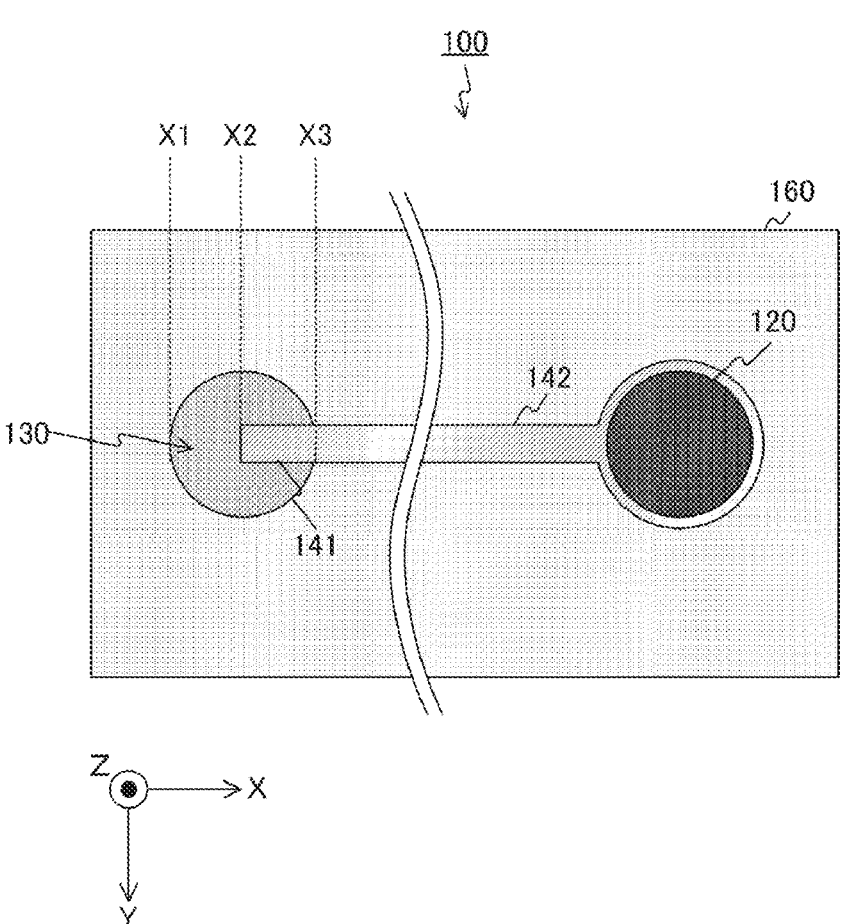
FIG. 2 is an example of a plan view of the semiconductor device in the first embodiment of the present technology.

FIG. 2 is an example of a plan view of the semiconductor device 100 in the first embodiment of the present technology. The figure is a plan view of an X-Y plane at the coordinate ZO in FIG. 1 as viewed from the Z-axis direction. The through hole 130 has a circular shape, and the through electrode 141 is disposed at the coordinate X3 closest to the bump 120 in the side wall thereof. The through electrode 141 and the bump 120 are connected to each other by the back surface wiring line 142 at the shortest distance.

In FIG. 2, a linear conductive film on the left side of the coordinate X2 corresponds to the through electrode 141, and a linear conductive film on the right side of the coordinate corresponds to the back surface wiring line 142.

[Method for Manufacturing Semiconductor Device]

Figure 3:
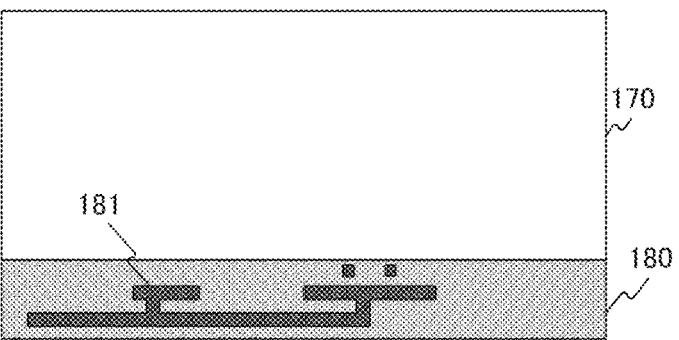
FIG. 3 is a diagram for explaining a manufacturing method up to film formation of an insulating film in the first embodiment of the present technology.
Figure 3:
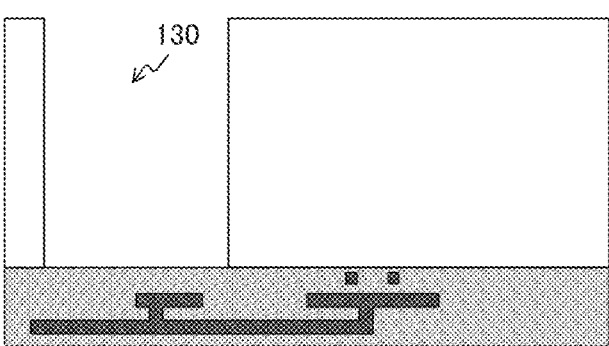
Figure 3:
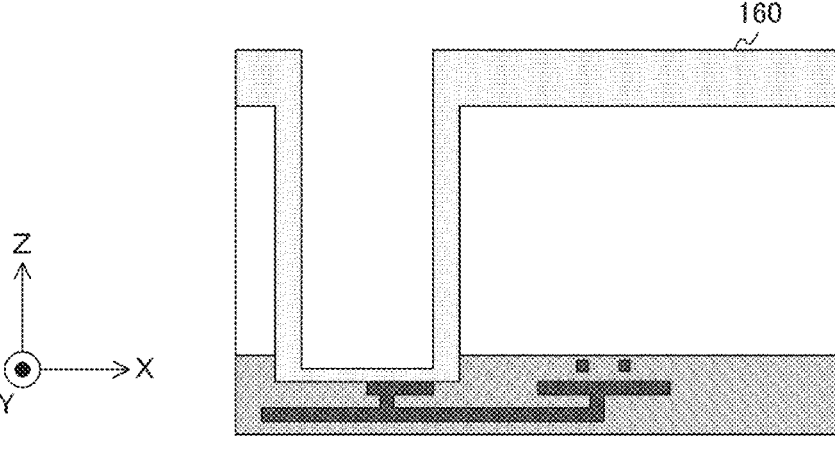

FIG. 3 is a diagram for explaining the manufacturing method up to film formation of the insulating film 160 in the first embodiment of the present technology. First, as exemplified in a of the figure, a manufacturing system forms the wiring layer 180 on the front surface of the semiconductor substrate 170 by an existing technology. The pad 181 is disposed only in a region where the through electrode 141 is disposed. Next, the semiconductor substrate 170 is thinned from the back surface by grinding, dry etching, or wet etching.

Next, as exemplified in b of the figure, the manufacturing system forms the through hole 130 in the semiconductor substrate 170 by dry etching. A diameter of the through hole 130 before formation of the insulating film 160 is, for example, about 10 to 100 micrometers ($\mu$m).

Next, as exemplified in c of the figure, the manufacturing system forms the insulating film 160 that separates the through electrode 141 and the semiconductor substrate 170 from each other. The insulating film 160 is formed by a plasma-enhanced chemical vapor deposition (PE-CVD) method, an atomic layer deposition (ALD) method, or resin coating. At this time, the insulating film 160 is formed so that an amount of film formation on the back surface side of the semiconductor substrate 170 is larger than that of the bottom portion of the through hole 130.

Figure 4:
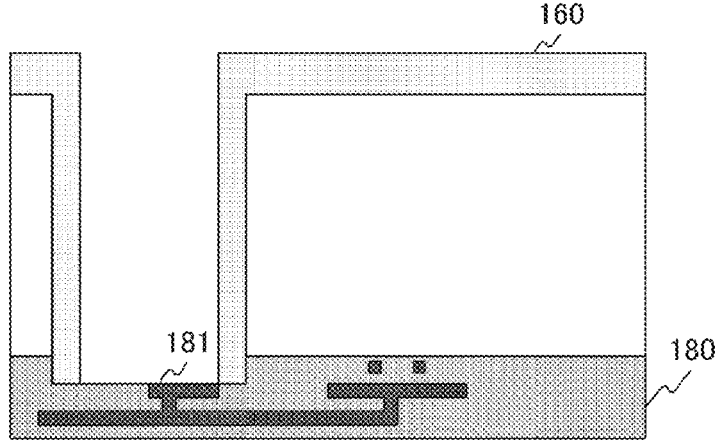
FIG. 4 is a diagram for explaining the manufacturing method up to film formation of a conductive film in the first embodiment of the present technology.
Figure 4:
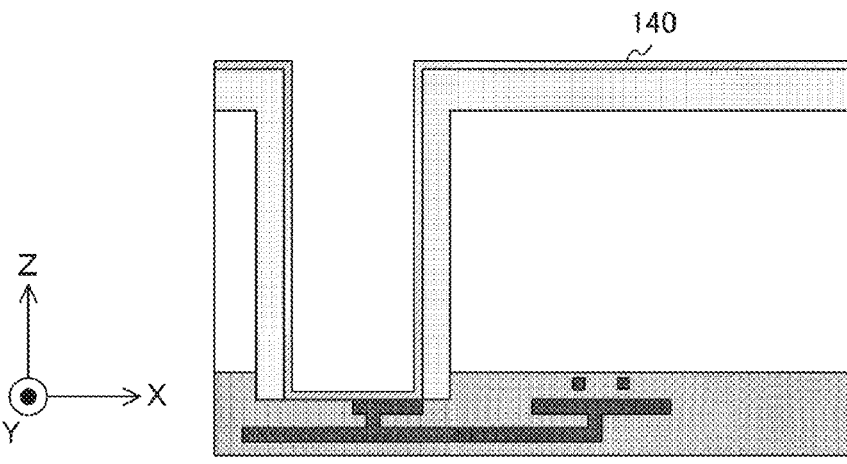

FIG. 4 is a diagram for explaining the manufacturing method up to film formation of a conductive film 140 in the first embodiment of the present technology. As exemplified in a of the figure, the manufacturing system removes the insulating film 160 at the bottom portion by dry etching. An amount of etching is controlled so that a place where the pad 181 is not formed does not come into contact with a lower layer wiring line. The insulating film 160 remains on the back surface side due to a difference in the amount of film formation of the insulating film 160 between the back surface and the bottom portion of the through hole described above.

Next, the through electrode 141 and the back surface wiring line 142 are simultaneously formed by a so-called semi-additive process. As exemplified in b of the figure, the manufacturing system forms films of a barrier metal and a seed metal (conductive film 140) by a plasma-enhanced physical vapor deposition (PE-PVD) method or a PE-CVD method.

Figure 5:
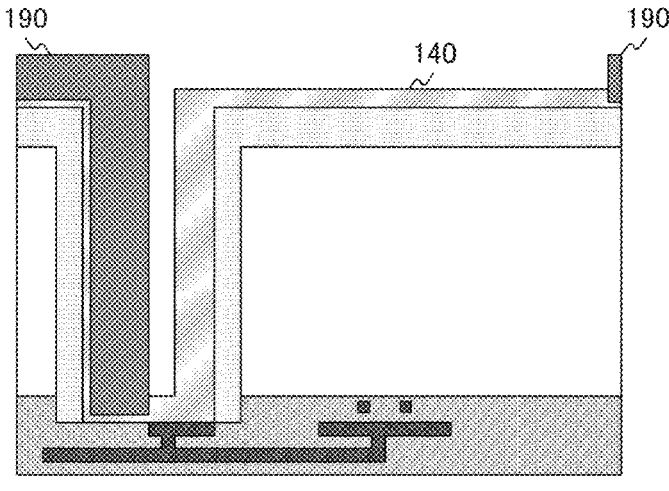
FIG. 5 is a diagram for explaining the manufacturing method up to formation of a protective film and a bump in the first embodiment of the present technology.
Figure 5:
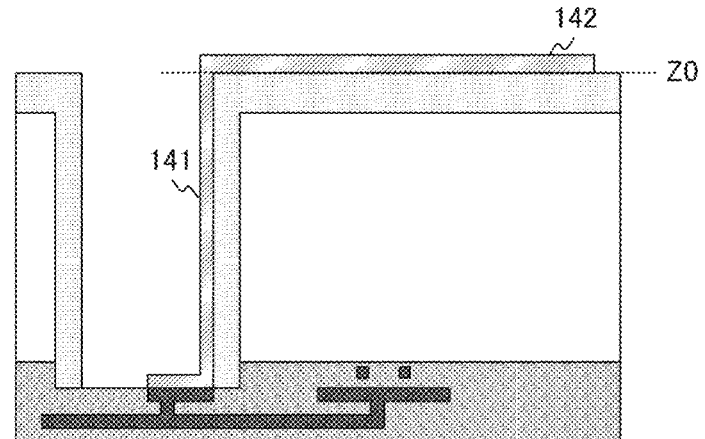
Figure 5:
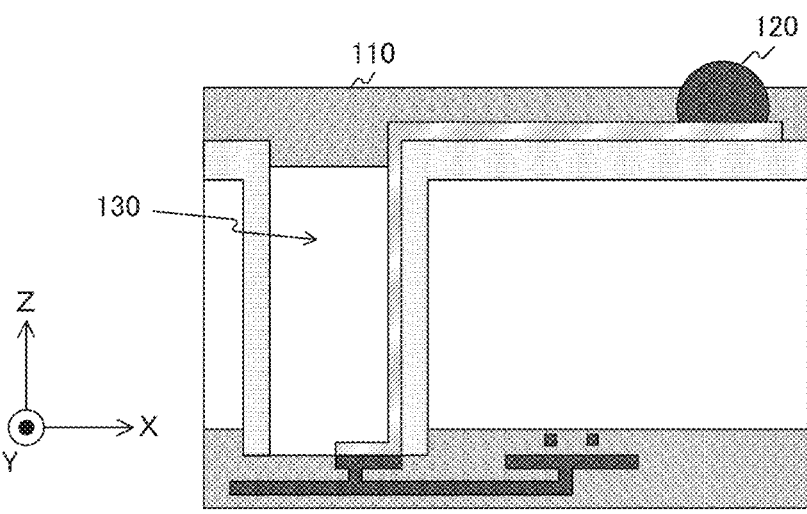

FIG. 5 is a diagram for explaining the manufacturing method up to formation of the protective film 110 and the bump 120 in the first embodiment of the present technology. As exemplified in a of the figure, the manufacturing system forms a mask with resist 190 by lithography in a region (a wiring space or the like) where the conductive film 140 is not finally disposed, and increases film thickness of the conductive film 140 in a region where the resist 190 is not formed by electroplating. The resist 190 is also patterned in the through electrode 141 so that the conductive film 140 is formed only in a part of the through hole 130.

Next, as exemplified in b of the figure, the manufacturing system removes the resist 190, then removes the conductive film 140 under the resist 190 by wet etching, and separates the through electrode 141 and the back surface wiring line 142. A wiring line width of the back surface wiring line 142 is less than or equal to the width of the through electrode 141, and is, for example, 3 to 50 micrometers ($\mu$m).

Next, as exemplified in c of the figure, the manufacturing system forms the protective film 110 by a coating method, and forms the bump 120 for connection to the outside. At this time, the manufacturing system does not completely fill the through hole 130 with the protective film 110 by adjusting a coating condition, and provides a gap.

Figure 6:
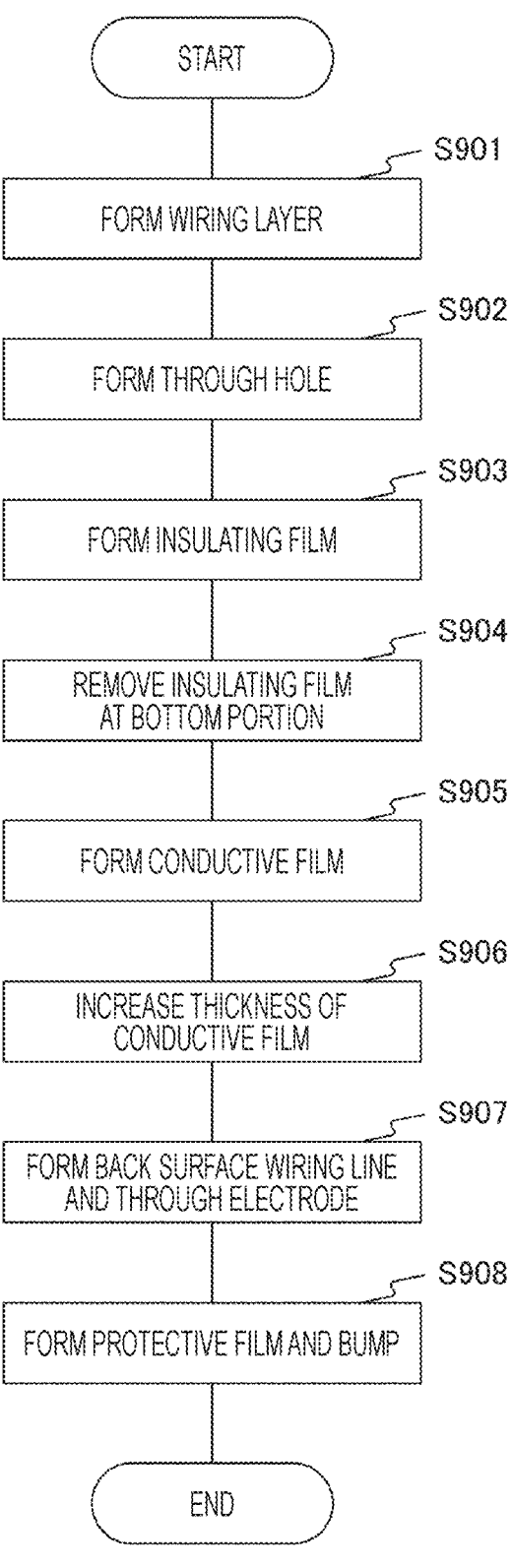
FIG. 6 is a flowchart illustrating an example of the manufacturing method in the first embodiment of the present technology.

FIG. 6 is a flowchart illustrating an example of the manufacturing method in the first embodiment of the present technology. First, the manufacturing system forms the wiring layer 180 on the front surface of the semiconductor substrate 170 by an existing technology (step S901), and forms the through hole 130 in the semiconductor substrate 170 by dry etching (step S902). Next, the manufacturing system forms the insulating film 160 by a PE-CVD method or the like (step S903).

Then, the manufacturing system removes the insulating film 160 at the bottom portion by dry etching (step S904), and forms the conductive film 140 by a PE-PVD method or the like (step S905).

Subsequently, the manufacturing system forms a mask with the resist 190 and increases film thickness of the conductive film 140 in a region other than the resist 190 (step S906). Next, the manufacturing system separates the through electrode 141 and the back surface wiring line 142 (step S907), and forms the protective film 110 and the bump 120 (step S908). After step S908, the manufacturing system executes various processes and ends the manufacturing of the semiconductor device 100.

As described above, according to the first embodiment of the present technology, since the through electrode 141 is formed along a part of the side wall and a part of the bottom portion of the through hole 130, thermal stress can be reduced as compared with a case where the through electrode 141 is formed on the entire side wall and bottom portion. Moreover, improvement of transmission performance of wiring can be expected due to an increase in the degree of freedom in wiring design.

2. Second Embodiment

In the first embodiment described above, the through electrode 141 is formed on a part of the side wall and the bottom portion of the through hole 130, but required thermal stress and resistivity may be different for each through electrode. A semiconductor device 100 of a second embodiment is different from that of the first embodiment in that an area of the through electrode is changed depending on an application.

Figure 7:
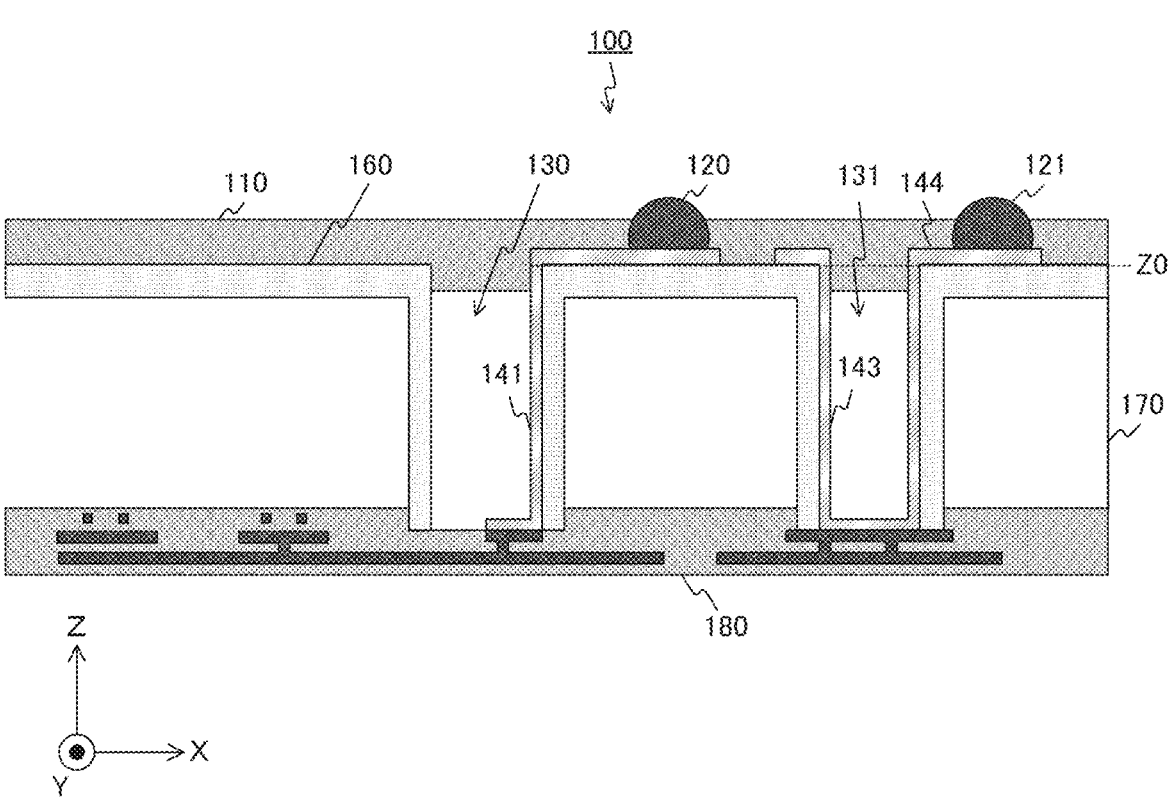
FIG. 7 is a cross-sectional view illustrating a configuration example of a semiconductor device in a second embodiment of the present technology.

FIG. 7 is a cross-sectional view illustrating a configuration example of the semiconductor device 100 in the second embodiment of the present technology. In the semiconductor device 100 of the second embodiment, a plurality of through holes is formed, such as through holes 130 and 131. Furthermore, depending on an application of a through hole, the area of the through electrode formed in the through hole is adjusted.

For example, in the through hole 130 or the like near a semiconductor element (not illustrated), an area of the conductive film is reduced to reduce the thermal stress. On the other hand, in the through hole 131 or the like where low resistance is required, the area of the conductive film is increased to reduce the resistivity.

In the figure, in the through hole 130, the through electrode 141 is formed along a part of the side wall and a part of the bottom portion. On the other hand, in the through hole 131, a through electrode 143 is formed along the entire side wall and the entire bottom portion. The through electrode 143 is connected to the bump 121 through a back surface wiring line 144. At the time of manufacturing, it is only required to adjust a lithography mask in the process of a of FIG. 5, and it is easier than a case where manufacturing is separately performed depending on the size of the through hole or the like.

Note that the through hole 131 is an example of a second through hole described in the claims, and the through electrode 143 is an example of a second inner through electrode described in the claims.

As described above, according to the second embodiment of the present technology, since the areas of the through electrodes 141 and 143 are made different from each other, the thermal stress and the resistivity can be adjusted to appropriate values for each through electrode.

3. Third Embodiment

In the first embodiment described above, the through electrode 141 is formed on the inner wall of the insulating film 160, but there is a case where it is necessary to reduce crosstalk. A semiconductor device 100 of a third embodiment is different from that of the first embodiment in that a through electrode is further formed along the side wall of the through hole 130.

Figure 8:
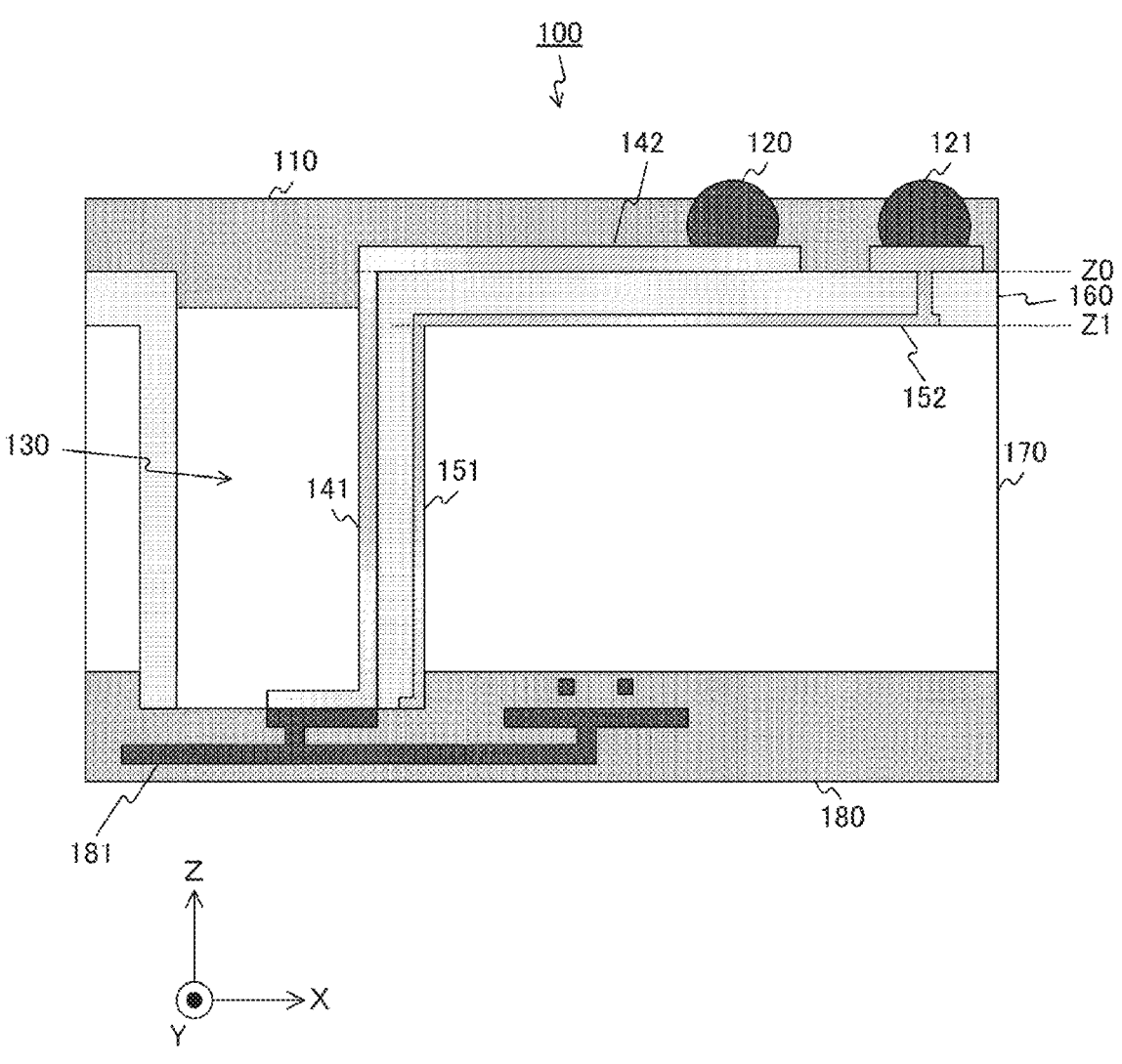
FIG. 8 is a cross-sectional view illustrating a configuration example of a semiconductor device in a third embodiment of the present technology.

FIG. 8 is a cross-sectional view illustrating a configuration example of the semiconductor device 100 in the third embodiment of the present technology. The semiconductor device 100 of the third embodiment is different from that of the first embodiment in that a through electrode 151, a back surface wiring line 152, and a bump 121 are further included.

The through electrode 151 is formed on the outer wall (in other words, between the insulating film 160 and the semiconductor substrate 170) of the insulating film 160 in the through hole 130. Note that the through electrode 151 is an example of an outer through electrode described in the claims.

Furthermore, the back surface wiring line 152 is wired between the insulating film 160 and the back surface. The through electrode 151 and the bump 121 are connected to each other by the back surface wiring line 152. Due to arrangement of the through electrode 151 and the back surface wiring line 152, crosstalk of a signal via the semiconductor substrate 170 is reduced. Furthermore, impedance control of the through electrode 141 is facilitated. Note that a line width of the through electrode 151 is preferably made wider than that of the through electrode 141. In the figure, the line width is a size in the Y-axis direction.

Figure 9:
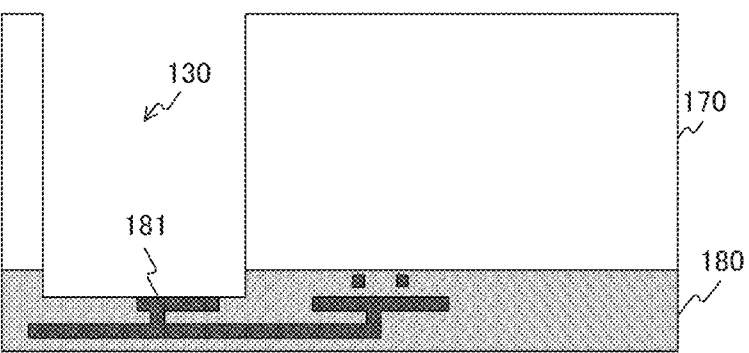
FIG. 9 is a diagram for explaining a manufacturing method up to film formation of the insulating film in the third embodiment of the present technology.
Figure 9:
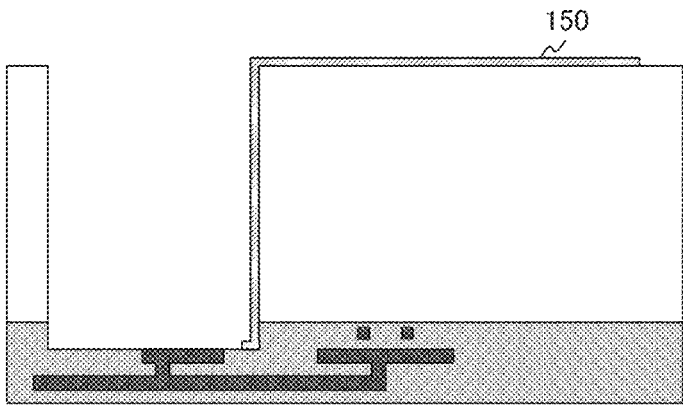
Figure 9:
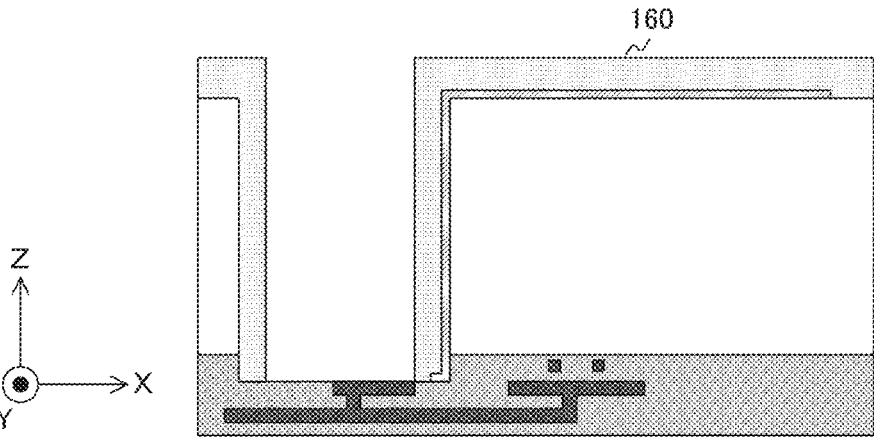

FIG. 9 is a diagram for explaining a manufacturing method up to film formation of the insulating film 160 in the third embodiment of the present technology. In the figure, a corresponds to b of FIG. 3 of the first embodiment. It is a state where the through hole 130 is formed in the semiconductor substrate 170.

Next, as exemplified in b of FIG. 9, the manufacturing system forms a conductive film 150 by a semi-additive method corresponding to b of FIG. 4 and a and b of FIG. 5.

Next, as exemplified in c of FIG. 9, the manufacturing system forms the insulating film 160, and removes the insulating film 160 at the bottom portion by dry etching.

Figure 10:
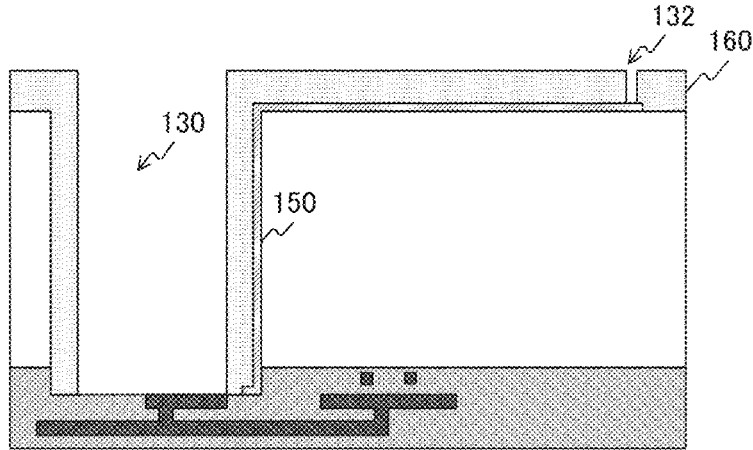
FIG. 10 is a diagram for explaining the manufacturing method up to formation of the protective film and the bump in the third embodiment of the present technology.
Figure 10:
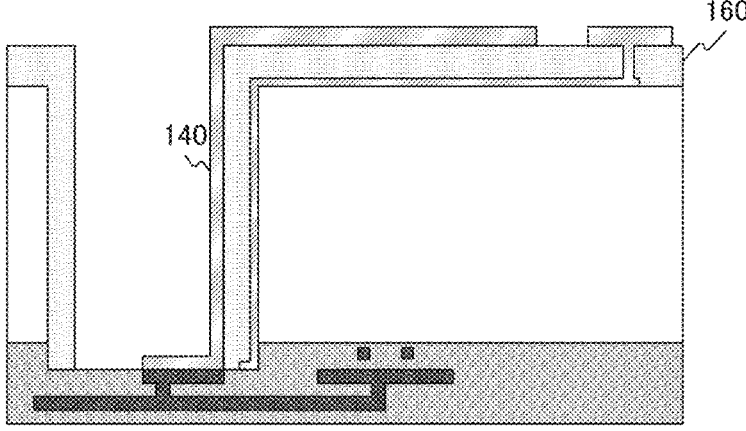
Figure 10:
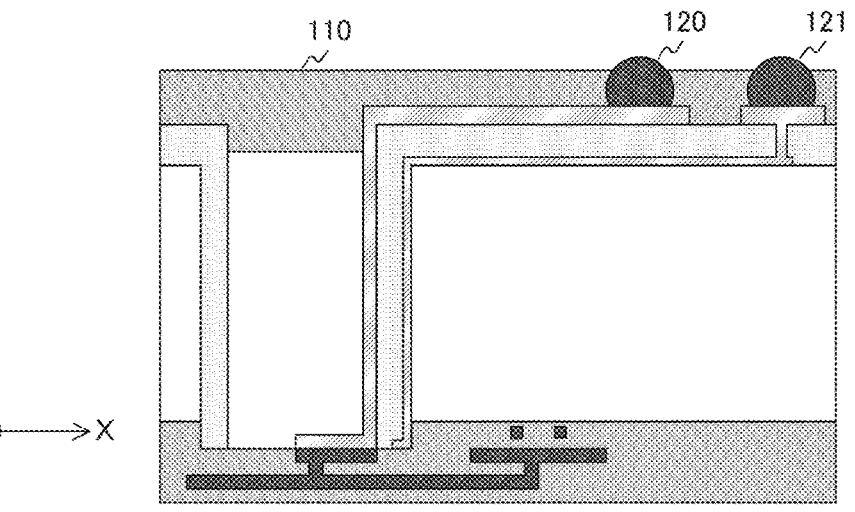

FIG. 10 is a diagram for explaining the manufacturing method up to formation of the protective film 110 and the bump 120 in the third embodiment of the present technology. As exemplified in a of the figure, the insulating film 160 on a planar portion on the back surface side of the semiconductor substrate 170 is processed to form a through hole 132 reaching the conductive film 150.

Next, as exemplified in b of the figure, the manufacturing system forms the conductive film 140 by a semi-additive method corresponding to b of FIG. 4 and a and b of FIG. 5. At this time, a conductive film is also embedded in the through hole 132 formed in a of FIG. 10 so that the conductive film 150 can be externally connected.

Next, as exemplified in c of FIG. 10, the manufacturing system forms the protective film 110 by a coating method, and forms the bump 121 for connection to the outside. At this time, the coating condition is adjusted, whereby the through hole 130 is not completely filled and a gap is provided.

Note that the second embodiment can be applied to the third embodiment.

As described above, according to the third embodiment of the present technology, since the through electrode 151 is further formed between the insulating film 160 and the semiconductor substrate 170, crosstalk can be reduced.

4. Fourth Embodiment

In the first embodiment described above, the through electrode 141 is disposed at the coordinate X3 closest to the transistor 183 in the X-Y plane, but there is a case where it is necessary to reduce characteristic fluctuation of the semiconductor element. A semiconductor device 100 of a fourth embodiment is different from that of the first embodiment in that a position of the through electrode 141 is changed.

Figure 11:
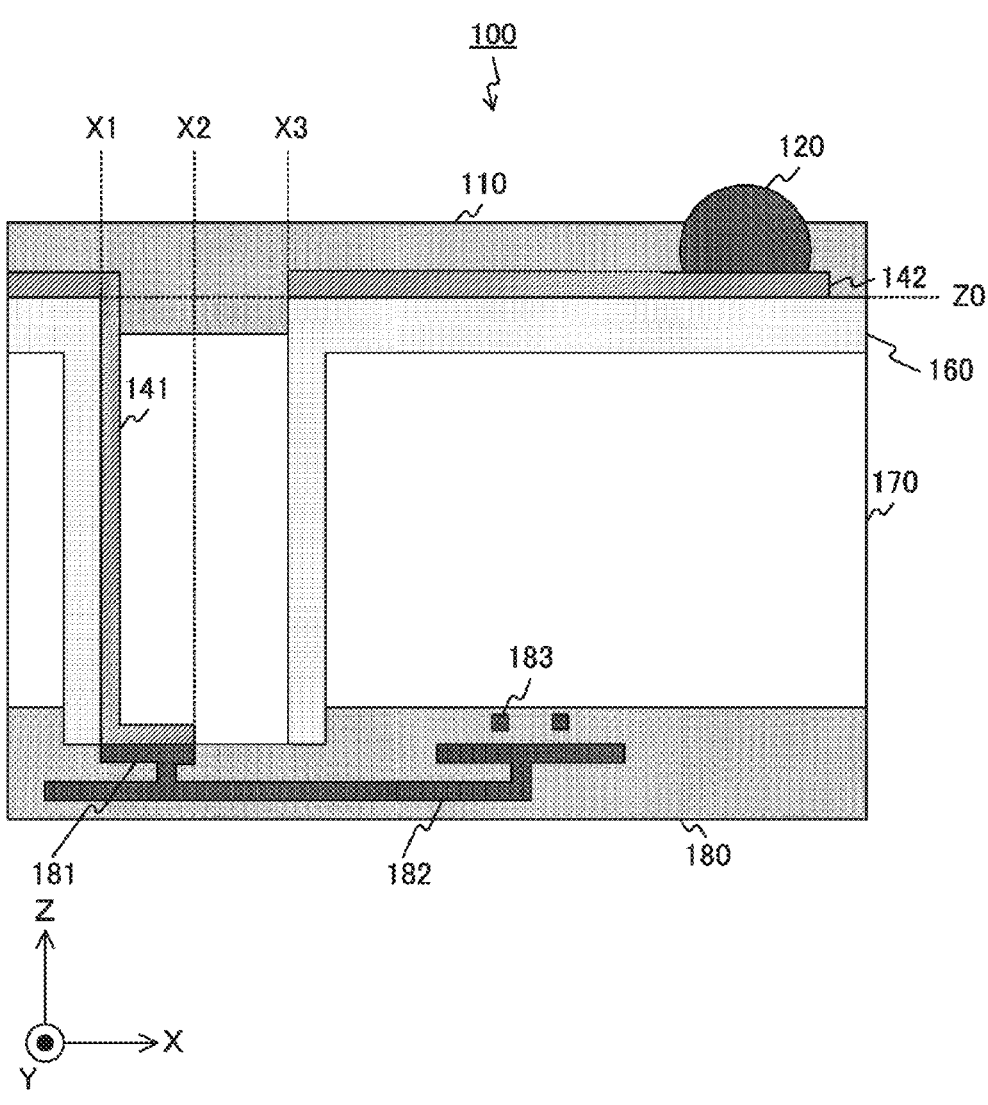
FIG. 11 is a cross-sectional view illustrating a configuration example of a semiconductor device in a fourth embodiment of the present technology.

FIG. 11 is a cross-sectional view illustrating a configuration example of the semiconductor device 100 in the fourth embodiment of the present technology. It is assumed that, also in the fourth embodiment, the transistor 183 closest to the through hole 130 is disposed on the right side of the through hole 130 as in the first embodiment. On the other hand, the through electrode 141 is disposed at a position farthest from the transistor 183 in the through hole 130 (the coordinate X1 of the left end of the through hole 130 in the figure).

Figure 12:
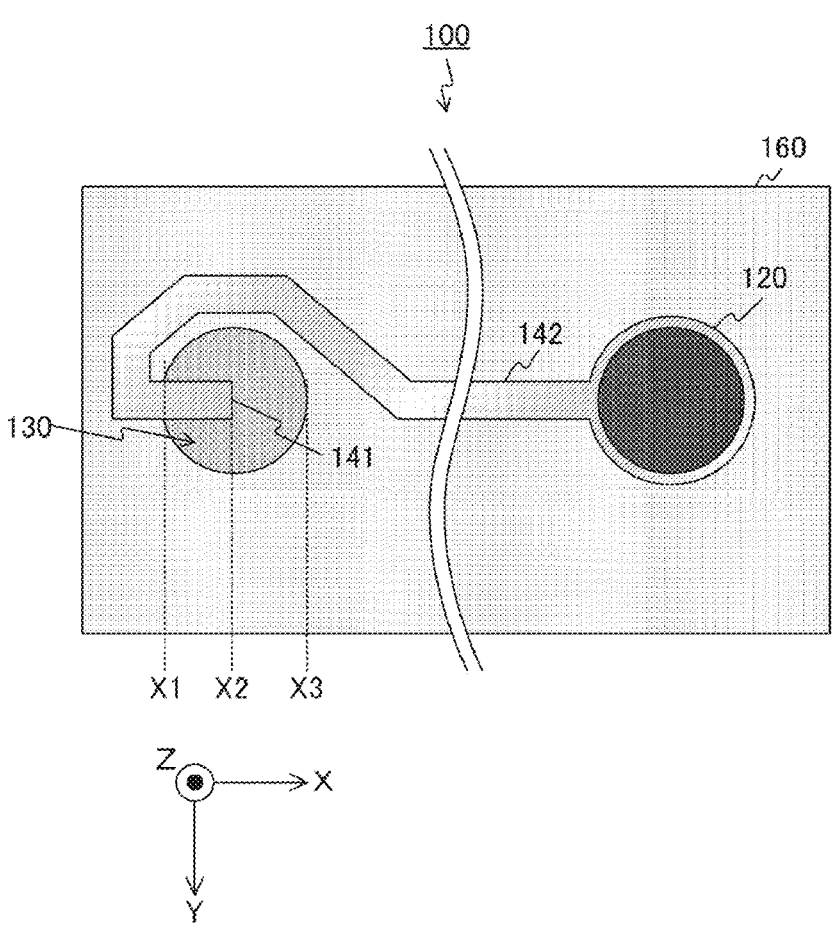
FIG. 12 is an example of a plan view of the semiconductor device in the fourth embodiment of the present technology.

FIG. 12 is an example of a plan view of the semiconductor device 100 in the fourth embodiment of the present technology. Since the position of the through electrode 141 is changed from the coordinate X3 to the coordinate X1, a wiring path of the back surface wiring line 142 is also changed. Note that although the bump 120 is disposed in the same direction as a direction from the through electrode 141 to the transistor 183 (the right direction in the figure), a position of the bump 120 is arbitrary, and the bump 120 may be disposed in the left direction or the like.

Even in a case where the through electrode 141 is formed only on a part of the inner wall and the bottom portion, a slight thermal stress is generated due to the conductive film 140 forming the through electrode 141. However, with the arrangement exemplified in FIGS. 11 and 12, it is possible to reduce peripheral semiconductor elements (not exemplified), and it is possible to reduce characteristic fluctuations of the semiconductor elements due to thermal stress.

Note that, the second embodiment and the third embodiment can be applied to the fourth embodiment.

As described above, according to the fourth embodiment of the present technology, since the through electrode 141 is disposed at the coordinate X1 farthest from the transistor 183, it is possible to reduce characteristic fluctuation of the semiconductor element due to thermal stress.

5. Fifth Embodiment

In the first embodiment described above, the bump 120 and the pad 181 are connected to each other by one back surface wiring line 142, but further reduction of thermal stress may be required. A semiconductor device 100 according to a fifth embodiment is different from that of the first embodiment in that a plurality of back surface wiring lines having the same potential is wired.

Figure 13:
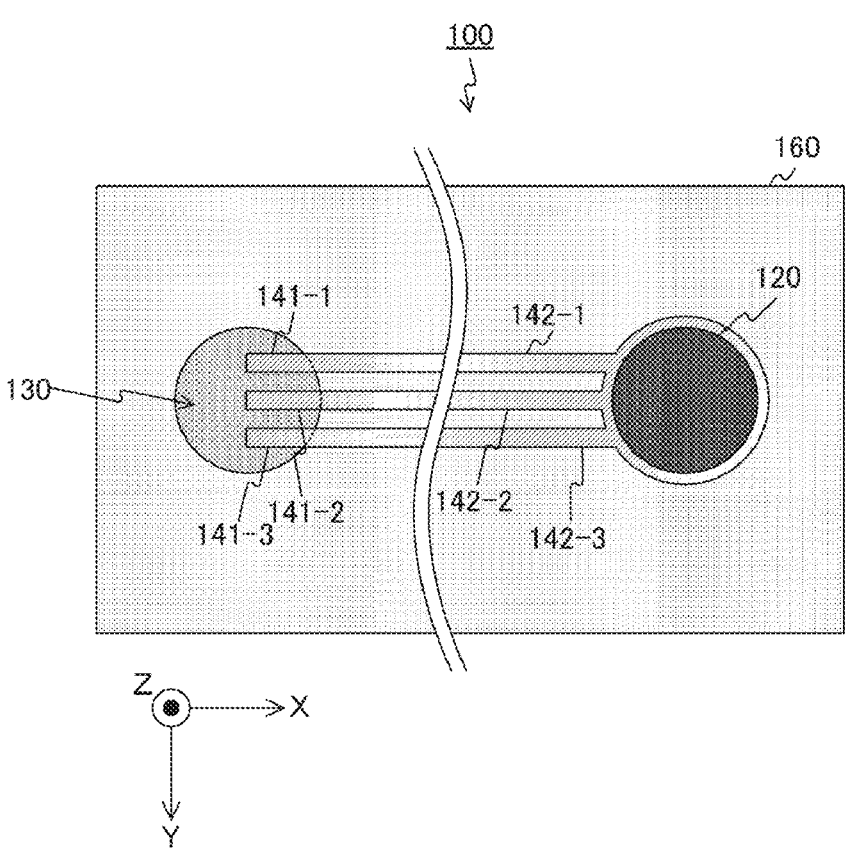
FIG. 13 is an example of a plan view of a semiconductor device in a fifth embodiment of the present technology.

FIG. 13 is an example of a plan view of the semiconductor device 100 in the fifth embodiment of the present technology. In the fifth embodiment, a plurality of through electrodes such as through electrodes 141-1, 141-2, and 141-3 is disposed on a part of the side wall of the through hole 130. The through electrode 141-1 and the bump 120 are connected to each other by a back surface wiring line 142-1, and the through electrode 141-2 and the bump 120 are connected to each other by a back surface wiring line 142-2. The through electrode 141-3 and the bump 120 are connected to each other by a back surface wiring line 142-3. Due to the connection in the figure, potentials of the three back surface wiring lines are the same potential. Note that each of the number of the through electrodes and the number of the back surface wiring lines is not limited to three.

As exemplified in the figure, by wiring the plurality of back surface wiring lines having the same potential, a volume per back surface wiring line can be reduced to further reduce the thermal stress. Furthermore, in high-frequency signal transmission, only a current on a wiring surface contributes to conduction due to a skin effect; however, in the configuration of the figure, a surface area increases, so that resistance near the surface can be lowered to improve conductivity.

Note that the second, third, and fourth embodiments can be applied to the fifth embodiment.

As described above, according to the fifth embodiment of the present technology, since the plurality of through electrodes and the plurality of back surface wiring lines having the same potential are formed, the thermal stress can be further reduced.

6. Sixth Embodiment

In the first embodiment described above, the bump 120 and the pad 181 are connected to each other by one back surface wiring line 142, but high integration of the through electrodes may be required. A semiconductor device 100 according to a sixth embodiment is different from that of the first embodiment in that a plurality of back surface wiring lines having different potentials is wired.

Figure 14:
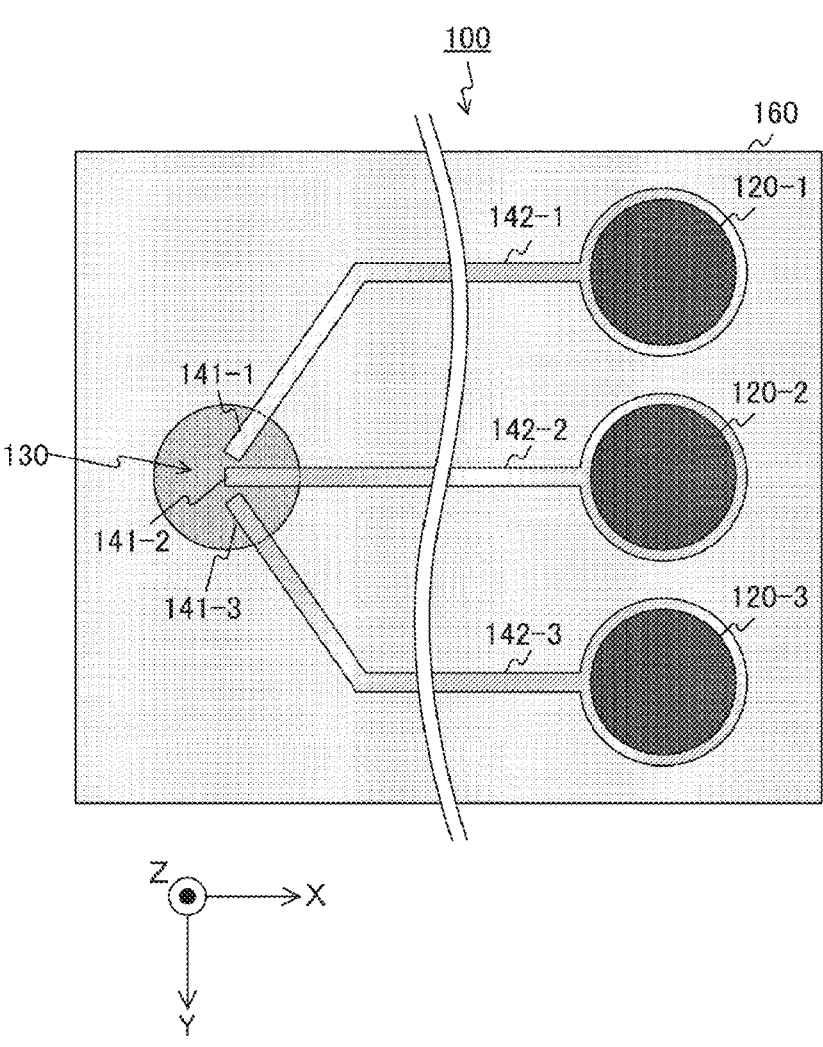
FIG. 14 is an example of a plan view of a semiconductor device in a sixth embodiment of the present technology.

FIG. 14 is an example of a plan view of the semiconductor device 100 in the sixth embodiment of the present technology. In the sixth embodiment, a plurality of through electrodes such as through electrodes 141-1, 141-2, and 141-3 is disposed on a part of the side wall of the through hole 130. Furthermore, a plurality of bumps such as bumps 120-1, 120-2, and 120-3 is formed on the back surface.

The through electrode 141-1 and the bump 120-1 are connected to each other by the back surface wiring line 142-1, and the through electrode 141-2 and the bump 120-2 are connected to each other by the back surface wiring line 142-2. The through electrode 141-3 and the bump 120-3 are connected to each other by the back surface wiring line 142-3. Due to the connection in the figure, potentials of the three back surface wiring lines have different values. Note that each of the number of the through electrodes, the number of the back surface wiring lines, and the number of the bumps is not limited to three.

As exemplified in the figure, by wiring the plurality of back surface wiring lines having different potentials, the through electrodes can be highly integrated.

Note that the second, third, fourth, and fifth embodiments can be applied to the sixth embodiment.

As described above, according to the sixth embodiment of the present technology, since the plurality of back surface wiring lines having different potentials is wired, high integration is possible.

7. Seventh Embodiment

In the first embodiment described above, the line width and the thickness of the through electrode 141 are substantially the same as those of the back surface wiring line 142, but at least one of them may be different. A semiconductor device 100 of a seventh embodiment is different from that of the first embodiment in that the line width and the thickness of the through electrode 141 are different from those of the back surface wiring line 142.

Figure 15:
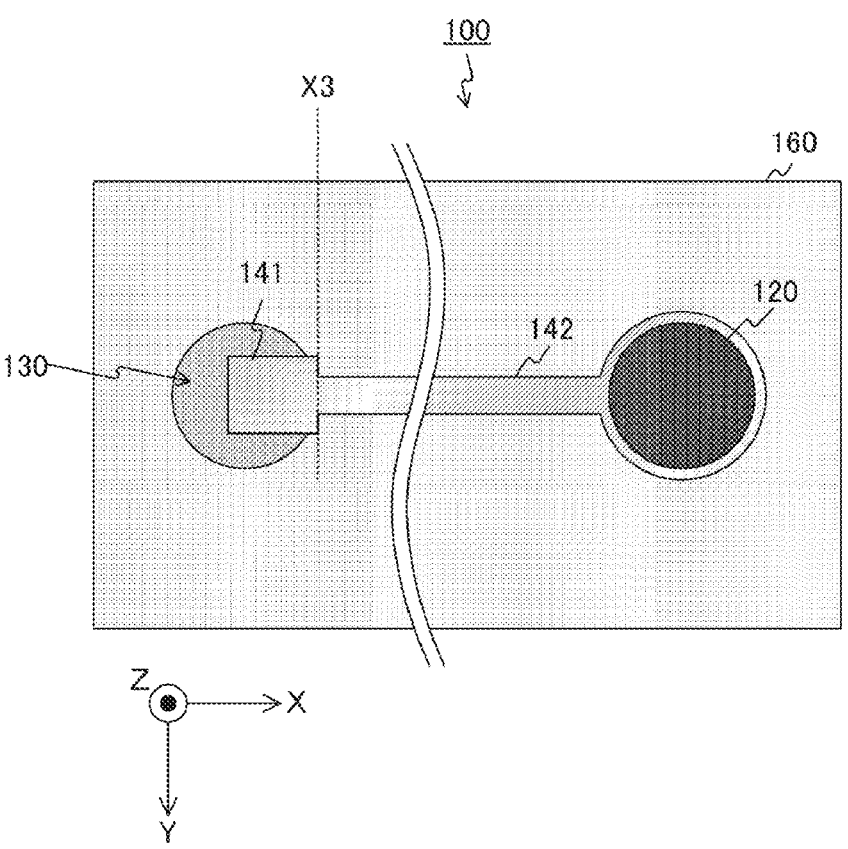
FIG. 15 is an example of a plan view of a semiconductor device in a seventh embodiment of the present technology.

FIG. 15 is an example of a plan view of the semiconductor device 100 in the seventh embodiment of the present technology. In the seventh embodiment, the line width of the through electrode 141 on the left side of the coordinate X3 is larger than that of the back surface wiring line 142 on the right side of the coordinate X3. Note that the thicknesses of the through electrode 141 and the back surface wiring line 142 can be set to different values. Furthermore, both the line width and the thickness of the through electrode 141 can be set to different values of those of the back surface wiring line 142.

In a case where the line width and the thickness of the through electrode 141 are different from those of the back surface wiring line 142, impedance mismatch may occur, but instead, the degree of freedom in design can be improved, and signal transmission performance can be improved. For manufacturing stability, the line width is preferably changed on the back surface wiring line side within a range of about several micrometers (μm) from a boundary between the through electrode 141 and the back surface wiring line 142.

Note that the second, third, fourth, fifth, and sixth embodiments can be applied to the seventh embodiment.

As described above, according to the seventh embodiment of the present technology, since the line width and thickness of the through electrode 141 are different from those of the back surface wiring line 142, the degree of freedom in design can be improved, and the signal transmission performance can be improved.

8. Eighth Embodiment

In the first embodiment described above, the shape of the through hole 130 is a circle but may be an ellipse. A semiconductor device 100 in an eighth embodiment is different from that of the first embodiment in that a through hole 130 having an elliptical shape is formed.

Figure 16:
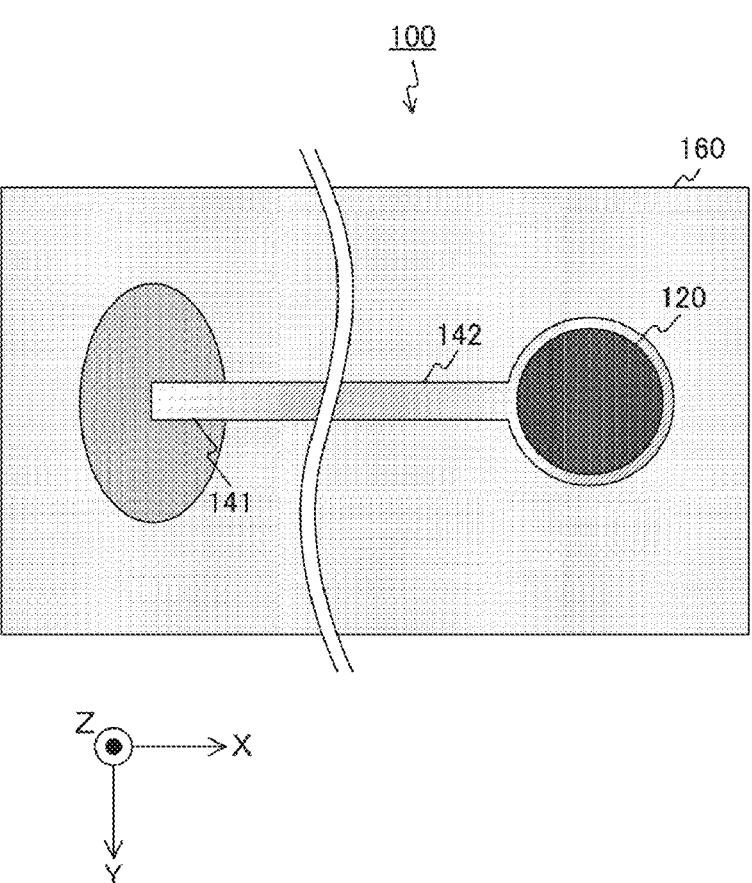
FIG. 16 is an example of a plan view of a semiconductor device in an eighth embodiment of the present technology.

FIG. 16 is an example of a plan view of the semiconductor device 100 in the eighth embodiment of the present technology. The semiconductor device 100 of the eighth embodiment is different from that of the first embodiment in that the shape of the through hole 130 is an ellipse. Furthermore, the through electrode 141 is formed on the minor axis of the ellipse. As a result, an aspect ratio of the through hole 130 decreases in the process of lithography in a of FIG. 5, so that the manufacturing is facilitated.

Note that the second, third, fourth, fifth, sixth, and seventh embodiments can be applied to the eighth embodiment.

As described above, according to the eighth embodiment of the present technology, since the shape of the through hole 130 is an ellipse and the through electrode 141 is formed on the minor axis of the ellipse, the manufacturing is facilitated.

9. Ninth Embodiment

In the first embodiment described above, the through electrode 141 is formed on a part of the side wall and the bottom portion of the through hole 130, but the through electrode 141 may be formed in a portion other than a slit portion. A semiconductor device 100 of a ninth embodiment is different from that of the first embodiment in that the through electrode 141 is formed in the portion other than the slit portion.

Figure 17:
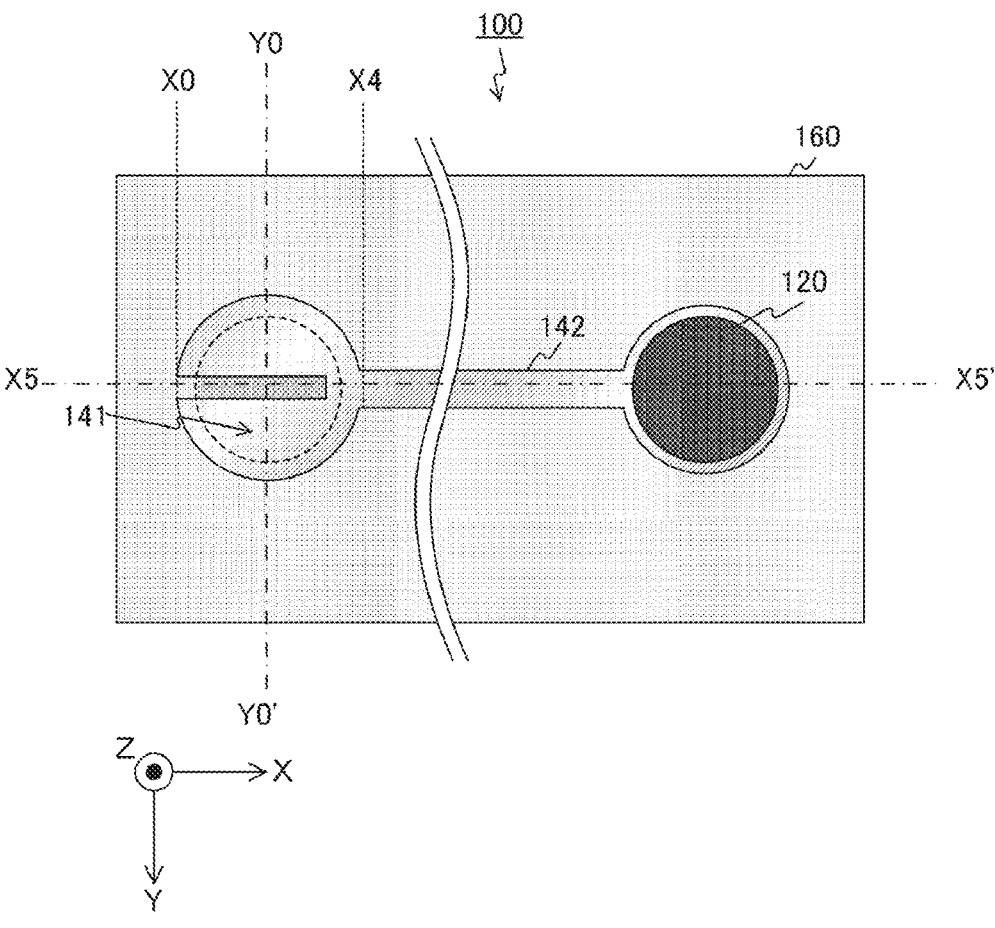
FIG. 17 is an example of a plan view of a semiconductor device in a ninth embodiment of the present technology.

FIG. 17 is an example of a plan view of the semiconductor device 100 in the ninth embodiment of the present technology. In the ninth embodiment, the through hole 130 is covered with a conductive film except for a slit when viewed from the Z-axis direction. The coordinate X0 is the left end of the through hole 130 before covering, and the coordinate X4 is the right end of the through hole 130 before covering. A dotted circle in the figure indicates the side wall (in other words, the inner wall of the insulating film 160) of the through hole 130 after covering. The conductive film inside the dotted line (inner wall) corresponds to the through electrode 141. The conductive film outside the dotted line corresponds to the back surface wiring line 142. On the inner wall, the through electrode 141 is formed along the inner periphery other than the slit portion. Furthermore, the through electrode 141 is formed in a portion other than the slit portion at the bottom portion of the through hole 130.

Figure 18:
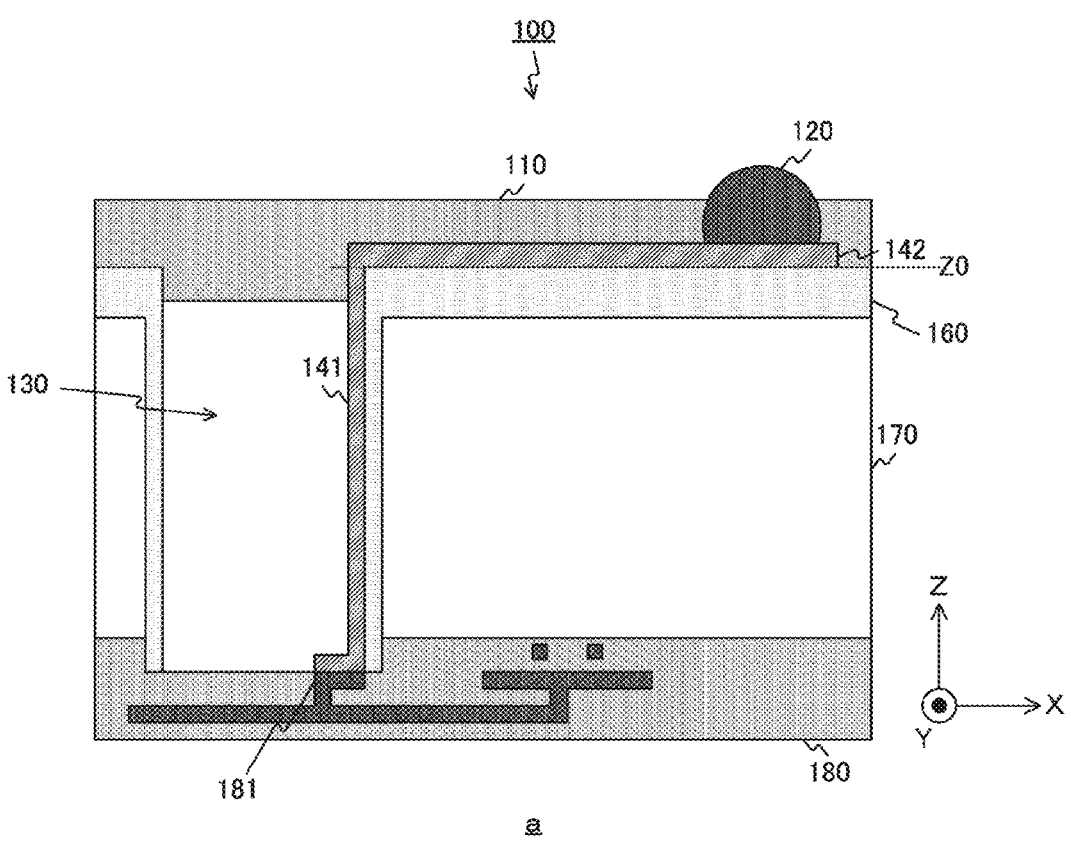
FIG. 18 is an example of a cross-sectional view illustrating a configuration example of the semiconductor device in the ninth embodiment of the present technology.
Figure 18:
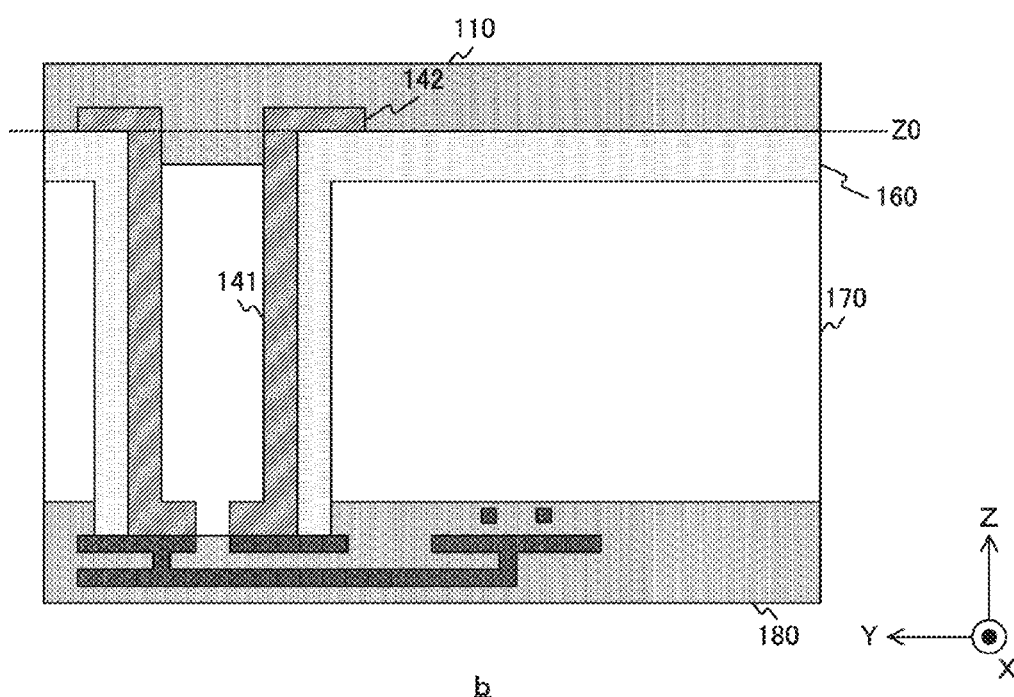

FIG. 18 is an example of a cross-sectional view illustrating a configuration example of the semiconductor device 100 in the ninth embodiment of the present technology. In the figure, a illustrates a cross-sectional view taken along a line segment X5-X5' of FIG. 17. In FIG. 17, b illustrates a cross-sectional view taken along a line segment Y0-Y0' of FIG. 17.

By forming the through electrode 141 in the portion other than the slit portion as exemplified in FIGS. 17 and 18, an area of the through electrode 141 can be made larger than that of the first embodiment.

Note that the second, third, fourth, fifth, sixth, seventh, and the eighth embodiments can be applied to the ninth embodiment.

As described above, according to the ninth embodiment of the present technology, since the through electrode 141 is formed in the portion other than the slit portion, the area of the through electrode 141 can be increased.

10. Tenth Embodiment

In the first embodiment described above, the entire side wall of the through hole is covered with the insulating film 160, but in a case where the insulating film 160 is a resin film, influence of heat stress is larger than that of an inorganic film. For this reason, there is a possibility that the through electrode 141 and the pad 181 are peeled off due to deformation or a crack of the insulating film 160. A semiconductor device 100 in a tenth embodiment is different from that of the first embodiment in that the insulating film 160 is formed on a part of the side wall.

Figure 19:
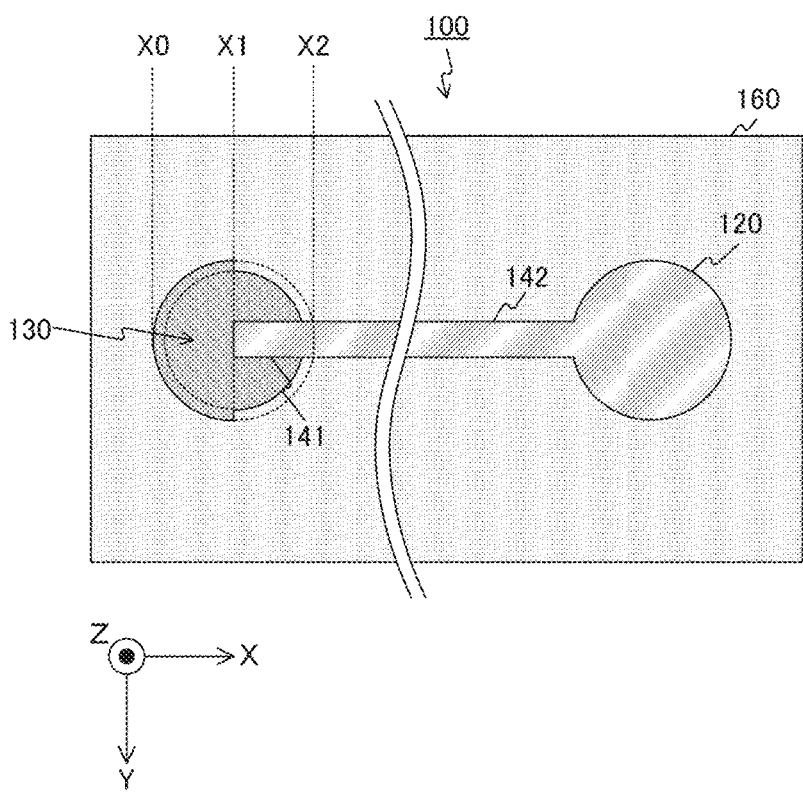
FIG. 19 is an example of a top view and a perspective view of a semiconductor device in a tenth embodiment of the present technology.
Figure 19:
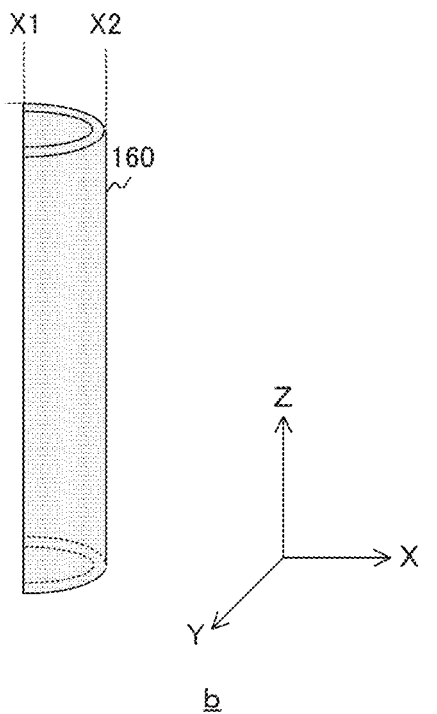

FIG. 19 is an example of a top view and a perspective view of the semiconductor device 100 in the tenth embodiment of the present technology. In the figure, a is an example of the top view of the semiconductor device 100. In the figure, b is an example of the perspective view of a portion covering the side wall, of the insulating film 160. It is assumed that, as the insulating film 160, for example, a photosensitive insulating resin film is used.

In the tenth embodiment, the insulating film 160 is formed to cover only a part of the side wall of the through hole 130. For example, as exemplified in a of the figure, the insulating film 160 is not formed on the side wall of the through hole 130 in a range from X0 to X1. On the other hand, in a range of X1 to X2, the insulating film 160 is formed on the side wall. As a result, as exemplified in b of the figure, a three-dimensional shape of the portion covering the side wall, of the insulating film 160 is a shape in which a pipe extending in the Z-axis direction is cut along the Z-axis to be divided into two, and only one of the two is left.

Figure 20:
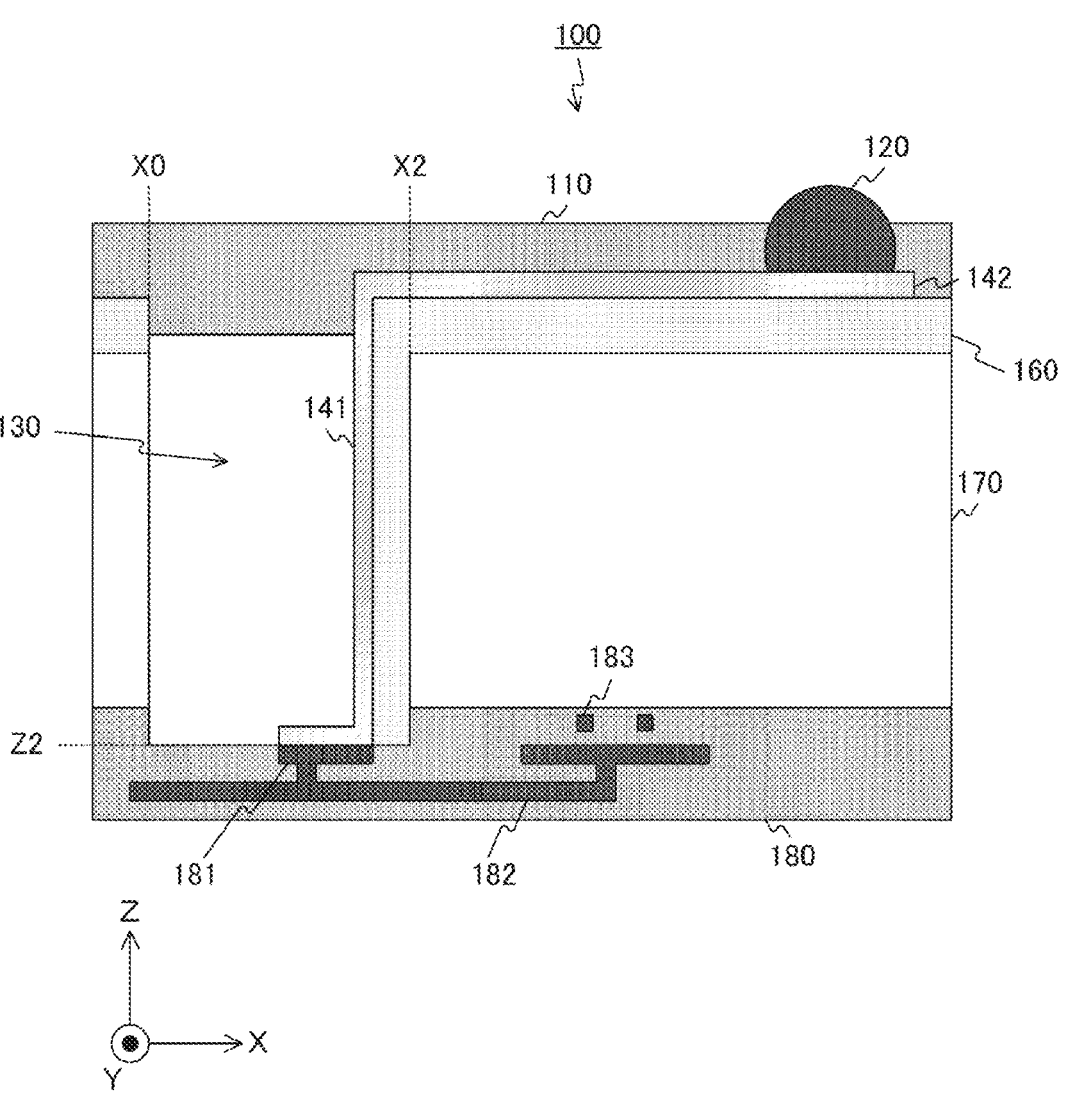
FIG. 20 is an example of a cross-sectional view of the semiconductor device in the tenth embodiment of the present technology.

FIG. 20 is an example of a cross-sectional view of the semiconductor device 100 in the tenth embodiment of the present technology. As exemplified in the figure, the through electrode 141 is formed along the side wall covered with the insulating film 160.

In the configuration in which the insulating film 160 is formed on the entire side wall of the through hole 130 as in the first embodiment, the insulating film 160 in the through hole 130 has a pipe shape, and a strong heat stress is generated in the circumferential direction due to a thermal load. On the other hand, in the tenth embodiment in which the insulating film 160 is formed on a part of the side wall, the insulating film 160 in the through hole 130 does not have a pipe shape, and a volume thereof is also reduced. For this reason, the heat stress can be greatly reduced. Arrangement and a ratio of the insulating film 160 in the through hole 130 can be freely changed depending on a layout of the through electrode 141.

Figure 21:
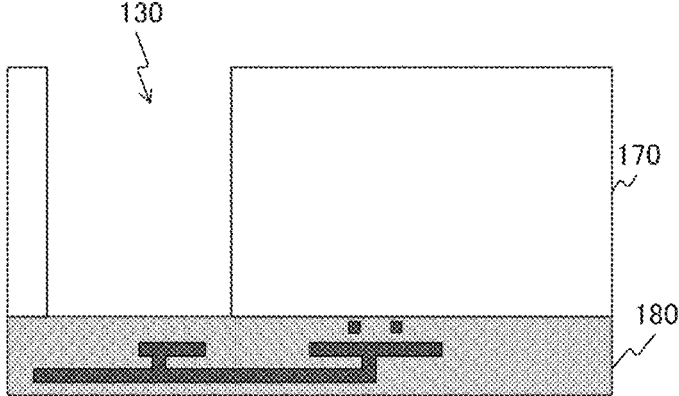
FIG. 21 is a diagram for explaining a manufacturing method up to removal of the insulating film in the tenth embodiment of the present technology.
Figure 21:
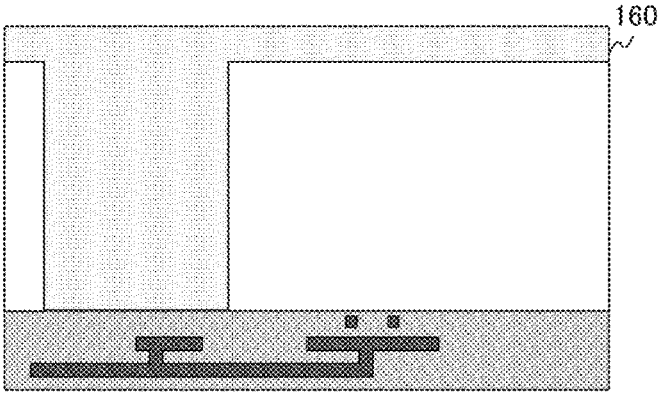
Figure 21:
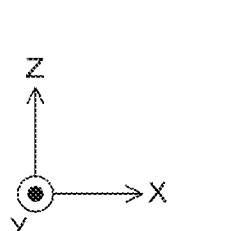
Figure 21:
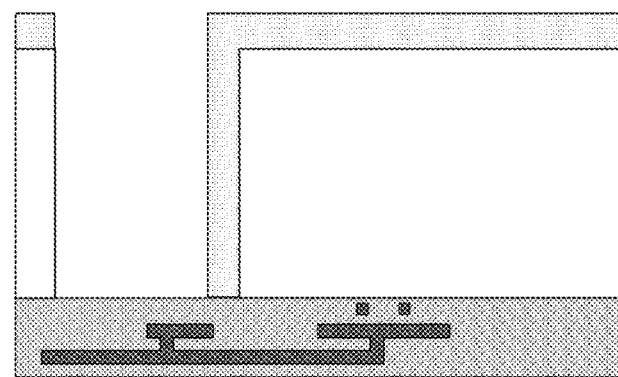

FIG. 21 is a diagram for explaining a manufacturing method up to removal of the insulating film in the tenth embodiment of the present technology. As exemplified in a of the figure, the manufacturing system forms the through hole 130 by dry etching in the semiconductor substrate 170 on which the wiring layer 180 is formed. Then, as exemplified in b of the figure, the manufacturing system embeds a photosensitive insulating resin film as the insulating film 160 in the through hole 130 by using a spin coating method or a lamination method. Subsequently, as exemplified in c of the figure, the manufacturing system removes the insulating film 160 in the through hole 130 by lithography while leaving a portion covering a part of the side wall.

Figure 22:
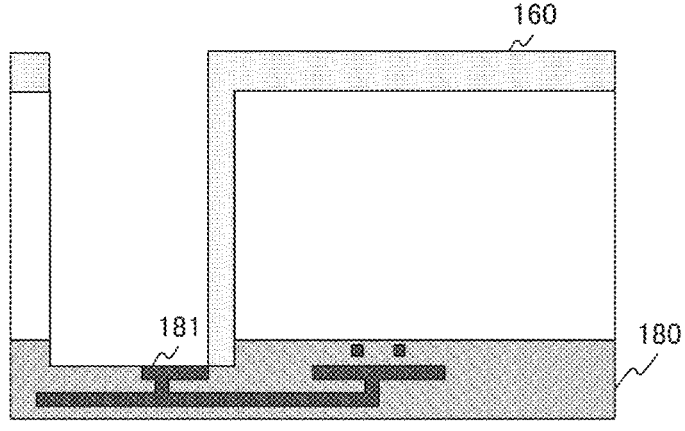
FIG. 22 is a diagram for explaining the manufacturing method up to formation of resist in the tenth embodiment of the present technology.
Figure 22:
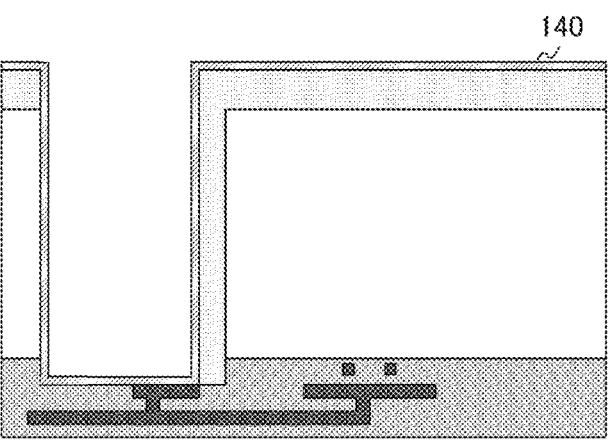
Figure 22:
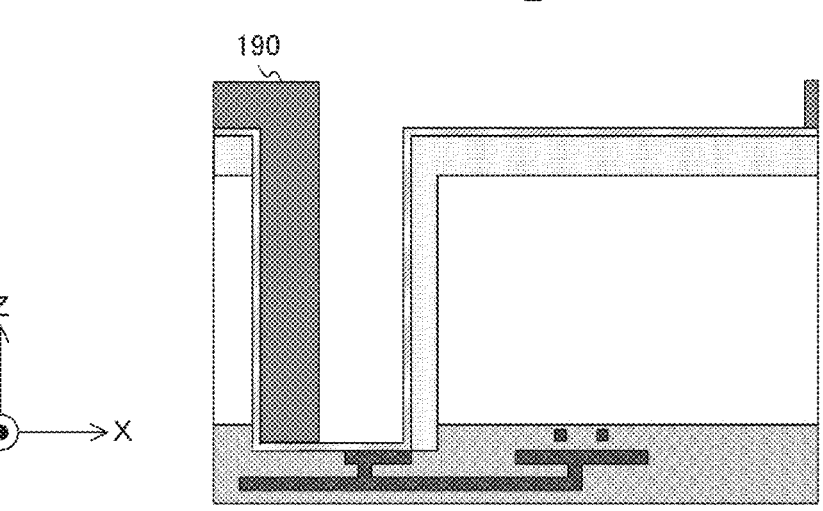

FIG. 22 is a diagram for explaining the manufacturing method up to formation of the resist 190 in the tenth embodiment of the present technology. As exemplified in a of the figure, the manufacturing system removes an insulating layer in the wiring layer 180 at the bottom portion of the through hole by dry etching to expose the pad 181. An amount of etching is controlled so that a place where the pad 181 is not formed does not come into contact with a lower layer wiring line. Then, as exemplified in b of the figure, the manufacturing system forms films of a barrier metal and a seed metal (conductive film 140) by a PE-PVD method or a PE-CVD method. Subsequently, as exemplified in c of the figure, the manufacturing system forms a mask with the resist 190 by lithography in a region (a wiring space or the like) where the conductive film 140 is not finally disposed.

Figure 23:
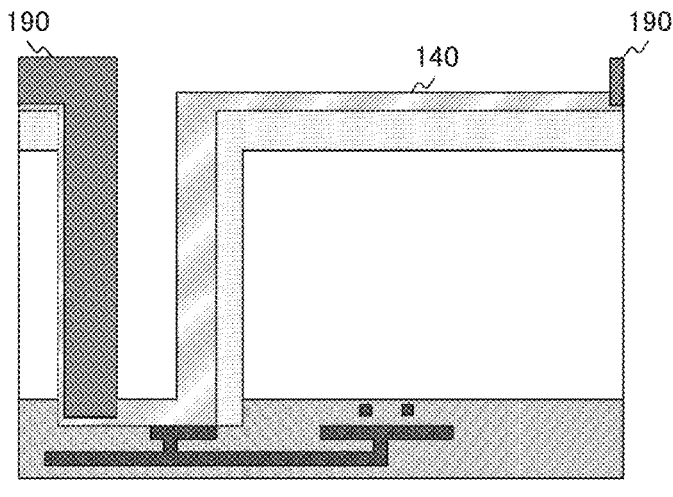
FIG. 23 is a diagram for explaining the manufacturing method up to formation of the protective film and the bump in the tenth embodiment of the present technology.
Figure 23:
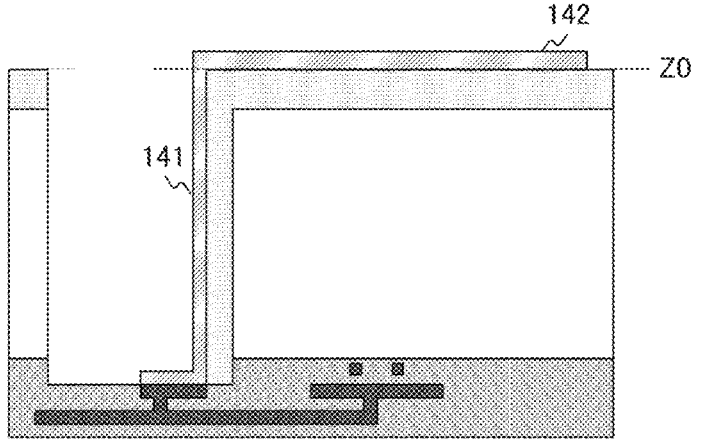
Figure 23:
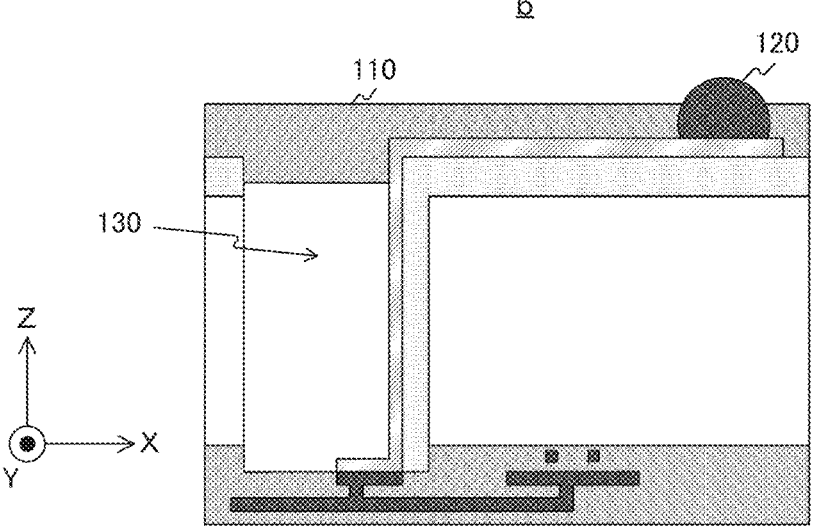

FIG. 23 is a diagram for explaining the manufacturing method up to formation of the protective film and the bump in the tenth embodiment of the present technology. As exemplified in a of the figure, the manufacturing system increases film thickness of the conductive film 140 in a region where the resist 190 is not formed by electroplating. Next, as exemplified in b of the figure, the manufacturing system removes the resist 190, then removes the conductive film 140 under the resist 190 by wet etching, and separates the through electrode 141 and the back surface wiring line 142. Next, as exemplified in c of the figure, the manufacturing system forms the protective film 110 by a coating method, and forms the bump 120 for connection to the outside. At this time, the manufacturing system does not completely fill the through hole 130 with the protective film 110 by adjusting a coating condition, and provides a gap.

Note that the second, third, fourth, fifth, sixth, seventh, eighth, and ninth embodiments can be applied to the tenth embodiment.

As described above, according to the tenth embodiment of the present technology, since the insulating film 160 covers a part of the side wall of the through hole 130, the heat stress can be reduced as compared with the case of covering the entire side wall.

[First Modification]

In the tenth embodiment described above, the semiconductor substrate 170 is exposed at a portion not covered with the insulating film 160, of the side wall of the through hole 130, and there may be a concern about device performance and characteristic influence. A semiconductor device 100 according to a first modification of the tenth embodiment is different from that of the tenth embodiment in that the side wall of the through hole 130 is covered with an inorganic film.

Figure 24:
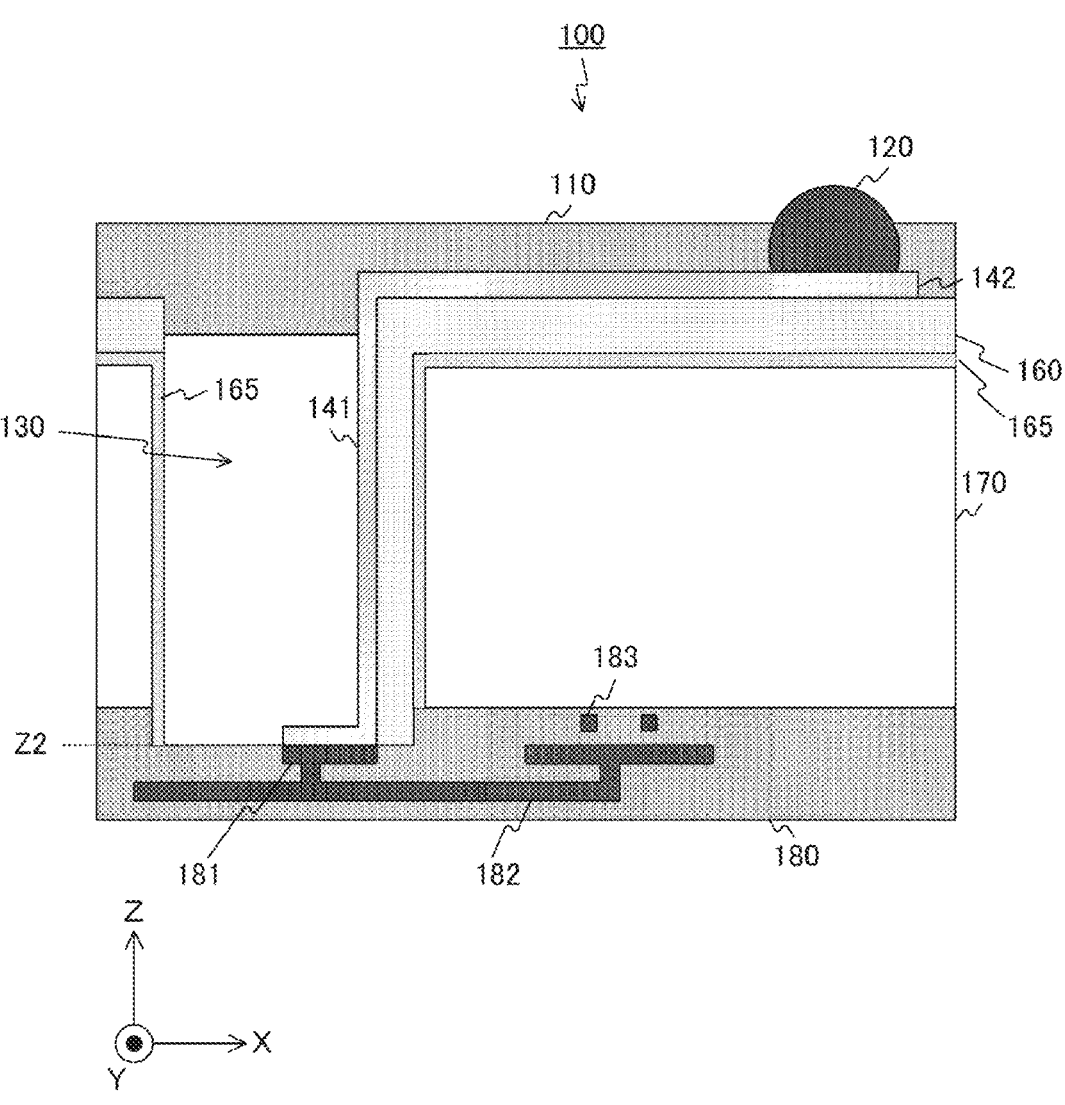
FIG. 24 is an example of a cross-sectional view of the semiconductor device in a first modification of the tenth embodiment of the present technology.

FIG. 24 is an example of a cross-sectional view of the semiconductor device 100 in the first modification of the tenth embodiment of the present technology. In the first modification of the tenth embodiment, the entire side wall of the through hole 130 and the back surface of the semiconductor substrate 170 are covered with an inorganic film 165. As the inorganic film 165, silicon dioxide (SiO$_2$), silicon nitride (SiN), a low-k film, or the like is used. The insulating film 160 is formed to cover a part of the inorganic film 165 in the through hole 130.

A film formation process for the inorganic film 165 is inserted between a and b of FIG. 21. Manufacturing processes after b of FIG. 21 are similar to those in the tenth embodiment. The inorganic film 165 formed at the bottom portion of the through hole is removed together with the insulating layer in the wiring layer 180 at the bottom portion of the through hole by dry etching in a of FIG. 22.

As described above, according to the first modification of the tenth embodiment of the present technology, since the side wall of the through hole 130 is covered with the inorganic film 165, a portion where the insulating film 160 is not formed, of the side wall can be covered with the inorganic film 165.

[Second Modification]

In the tenth embodiment described above, one through electrode is disposed in the through hole 130, but two or more through electrodes can be arranged. In this case, a plurality of regions of the side wall can be covered with the insulating film 160 in accordance with arrangement of the through electrodes. A semiconductor device 100 according to a second modification of the tenth embodiment is different from that of the tenth embodiment in that the plurality of regions of the side wall is covered with the insulating film 160.

Figure 25:
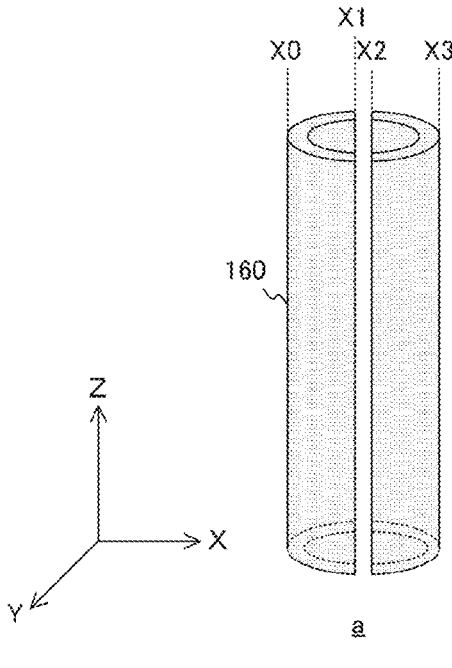
FIG. 25 is an example of a perspective view and a top view of the semiconductor device in a second modification of the tenth embodiment of the present technology.
Figure 25:
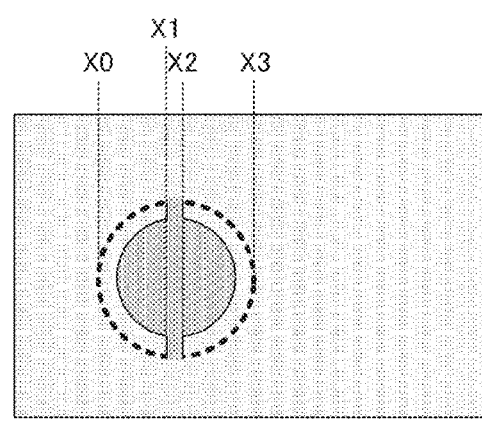
Figure 25:
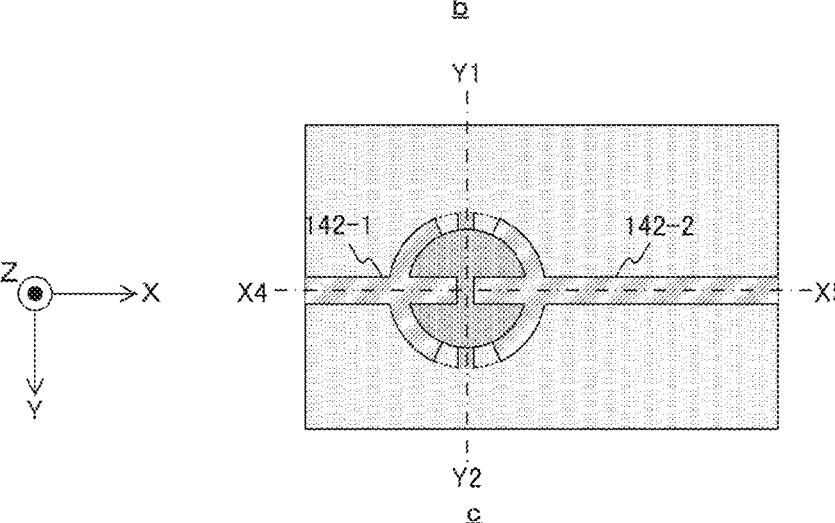

FIG. 25 is a diagram illustrating an example of a perspective view and a top view of the semiconductor device 100 in the second modification of the tenth embodiment of the present technology. In the figure, a is an example of the perspective view of a portion covering the side wall of the insulating film 160. In the figure, b and c are examples of the top view of the semiconductor device 100. However, in b of the figure, the through electrode and the back surface wiring line are omitted to clearly illustrate the regions covered with the insulating film 160.

As exemplified in a and b of the figure, two regions of the side wall are covered with the insulating film 160. One of the two regions is an arc-shaped region from X0 to X1 when viewed from the Z-axis direction, and the other is an arc-shaped region from X2 to X3. A thick dotted line in b of the figure indicates a region covered with the insulating film 160 in the side wall. These two regions are separated from each other.

Figure 26:
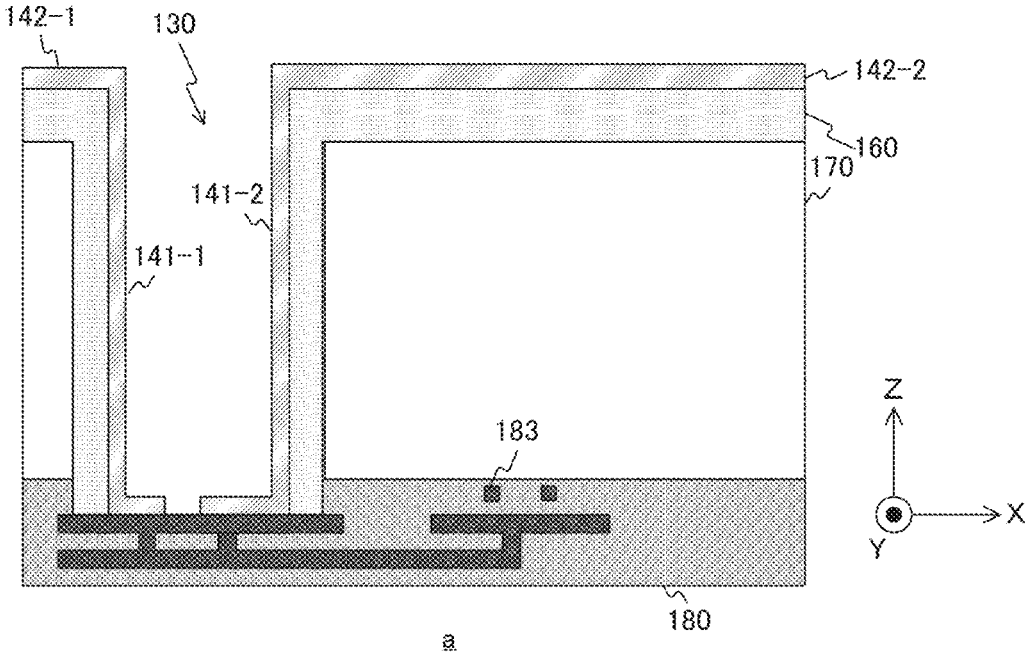
FIG. 26 is an example of a cross-sectional view of the semiconductor device in the second modification of the tenth embodiment of the present technology.
Figure 26:
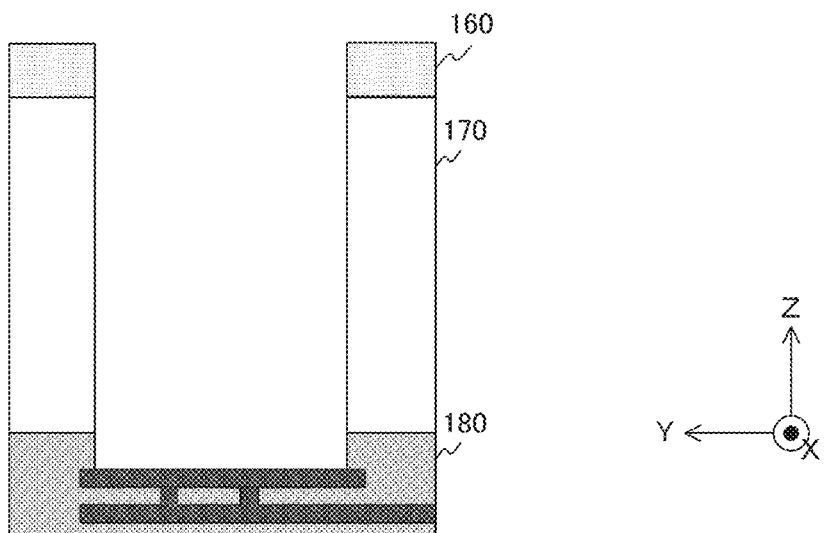

FIG. 26 is an example of a cross-sectional view of the semiconductor device 100 in the second modification of the tenth embodiment of the present technology. In FIG. 26, a is a cross-sectional view taken along a line segment X4-X5 in c of FIG. 25. In FIG. 26, b is a cross-sectional view taken along a line segment Y1-Y2 in c of FIG. 25.

As exemplified in FIGS. 25 and 26, the through electrode 141-1 is formed along the left side portion of the two regions covered with the insulating film 160, and is connected to the back surface wiring line 142-1. Furthermore, the through electrode 141-2 is formed along the right side portion and is connected to the back surface wiring line 142-2.

As described above, according to the second modification of the tenth embodiment of the present technology, since the insulating film 160 covers the two regions of the side wall, the through electrodes 141-1 and 141-2 can be arranged.

[Third Modification]

In the second modification of the tenth embodiment described above, the insulating film 160 is formed in the two regions, but the arrangement and ratio of the insulating film 160 in the through hole 130 can be freely changed depending on the layout of the through electrode 141. A semiconductor device 100 according to a third modification of the tenth embodiment is different from the second modification of the tenth embodiment in that the arrangement and ratio of the insulating film 160 are changed.

Figure 27:
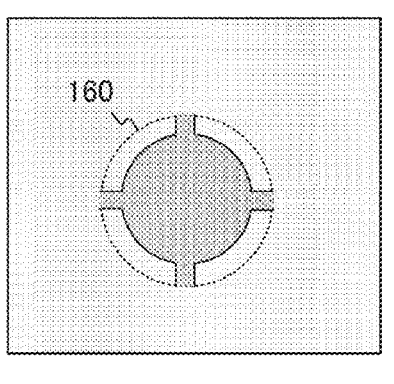
FIG. 27 is an example of a top view of the semiconductor device in a third modification of the tenth embodiment of the present technology.
Figure 27:
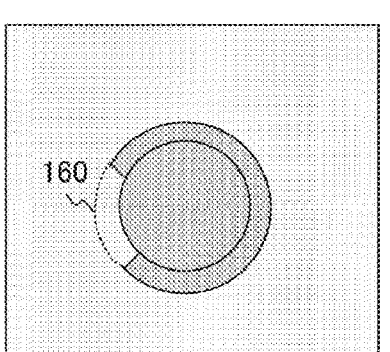
Figure 27:
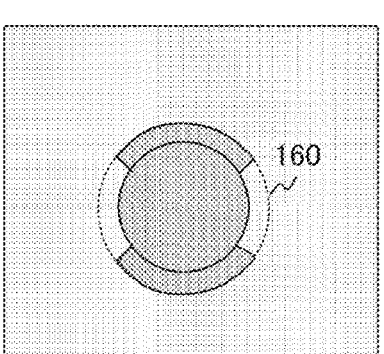
Figure 27:
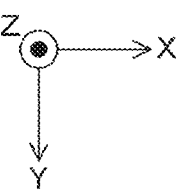

FIG. 27 is an example of a top view of the semiconductor device in the third modification of the tenth embodiment of the present technology. In the figure, a illustrates a top view in a case where the insulating film 160 is formed in four regions. In the figure, b illustrates a top view in a case where an area covered with the insulating film 160 is increased. In the figure, c illustrates a top view in a case where the area covered with the insulating film 160 is decreased. In the figure, d illustrates a top view in a case where the insulating film 160 is formed in two regions and an area of each region is decreased. However, in the figure, the through electrode 141 and the back surface wiring line 142 are omitted to clearly illustrate the regions covered with the insulating film 160.

As exemplified in a of the figure, four regions of the side wall can be covered with the insulating film 160. Furthermore, as exemplified in b of the figure, the area covered with the insulating film 160 can be made larger than the area of an uncovered portion. Conversely, as exemplified in c of the figure, the area covered with the insulating film 160 can be made smaller than the area of the uncovered portion. Furthermore, as exemplified in d of the figure, the two regions can be covered with the insulating film 160, and the area of each region can be made smaller than half of the entire side wall.

As described above, the arrangement and ratio of the insulating film 160 can be freely changed depending on layouts of the conductive film 140 and the through electrode 141. The above-described various patterns of the insulating film 160 can be manufactured by changing a layout of a mask pattern of the lithography in c of FIG. 21. Furthermore, in a case where a plurality of through holes is formed in the semiconductor device 100, the through holes can also be covered in different shapes. For example, a through hole can be covered with the shape in a of the figure, and another through hole can be covered with the shape in b of the figure. Similarly, a combination of a and c of the figure and a combination of a, b, and c of the figure can also be used.

As described above, according to the third modification of the tenth embodiment of the present technology, since the arrangement and ratio of the insulating film 160 are changed, it is possible to cope with various layouts of the conductive film and the through hole.

Figure 28:
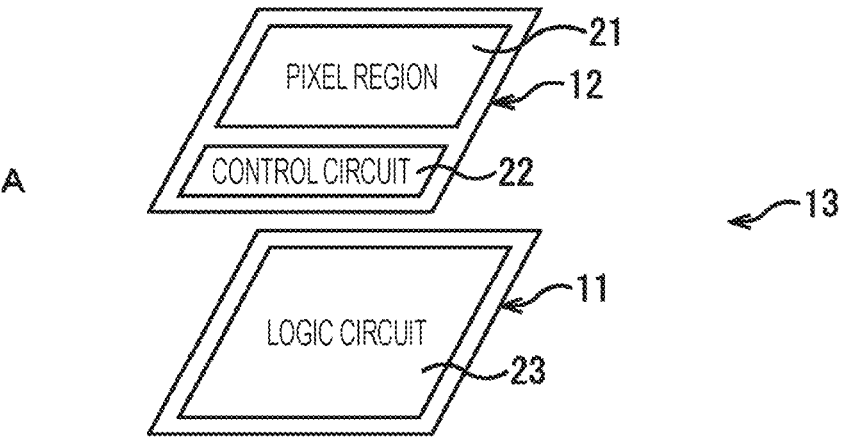
FIG. 28 is a diagram illustrating an example of a laminated structure of a solid-state imaging device in the embodiments of the present technology.
Figure 28:
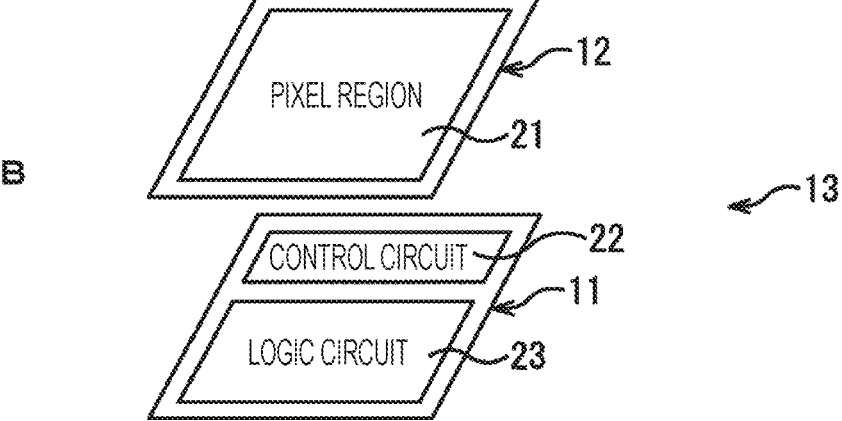

Note that the first to tenth embodiments can also be applied to a configuration in which a plurality of substrates is laminated. FIG. 28 is a diagram illustrating an example of a laminated structure of a solid-state imaging device in the embodiments of the present technology. The solid-state imaging device is a semiconductor package in which a laminated substrate 13 configured by laminating a lower substrate 11 and an upper substrate 12 is packaged.

For example, as illustrated in A of FIG. 28, a pixel region 21 in which pixel units that perform photoelectric conversion are two-dimensionally arranged and a control circuit 22 that controls the pixel units are formed on the upper substrate 12, and a logic circuit 23 such as a signal processing circuit that processes pixel signals output from the pixel units is formed on the lower substrate 11.

Alternatively, as illustrated in B of FIG. 28, only the pixel region 21 may be formed on the upper substrate 12, and the control circuit 22 and the logic circuit 23 may be formed on the lower substrate 11.

A structure of the through electrode 141 exemplified in the first to tenth embodiments is applied to a through chip via (TCV) provided on the lower substrate 11 or the like.

11. Application Example to Mobile Body

The technology according to the present disclosure (the present technology) can be applied to various products. The technology according to the present disclosure may be implemented as a device mounted on any type of mobile body, for example, a car, an electric car, a hybrid electric car, a motorcycle, a bicycle, a personal mobility, an airplane, a drone, a ship, a robot, or the like.

Figure 29:
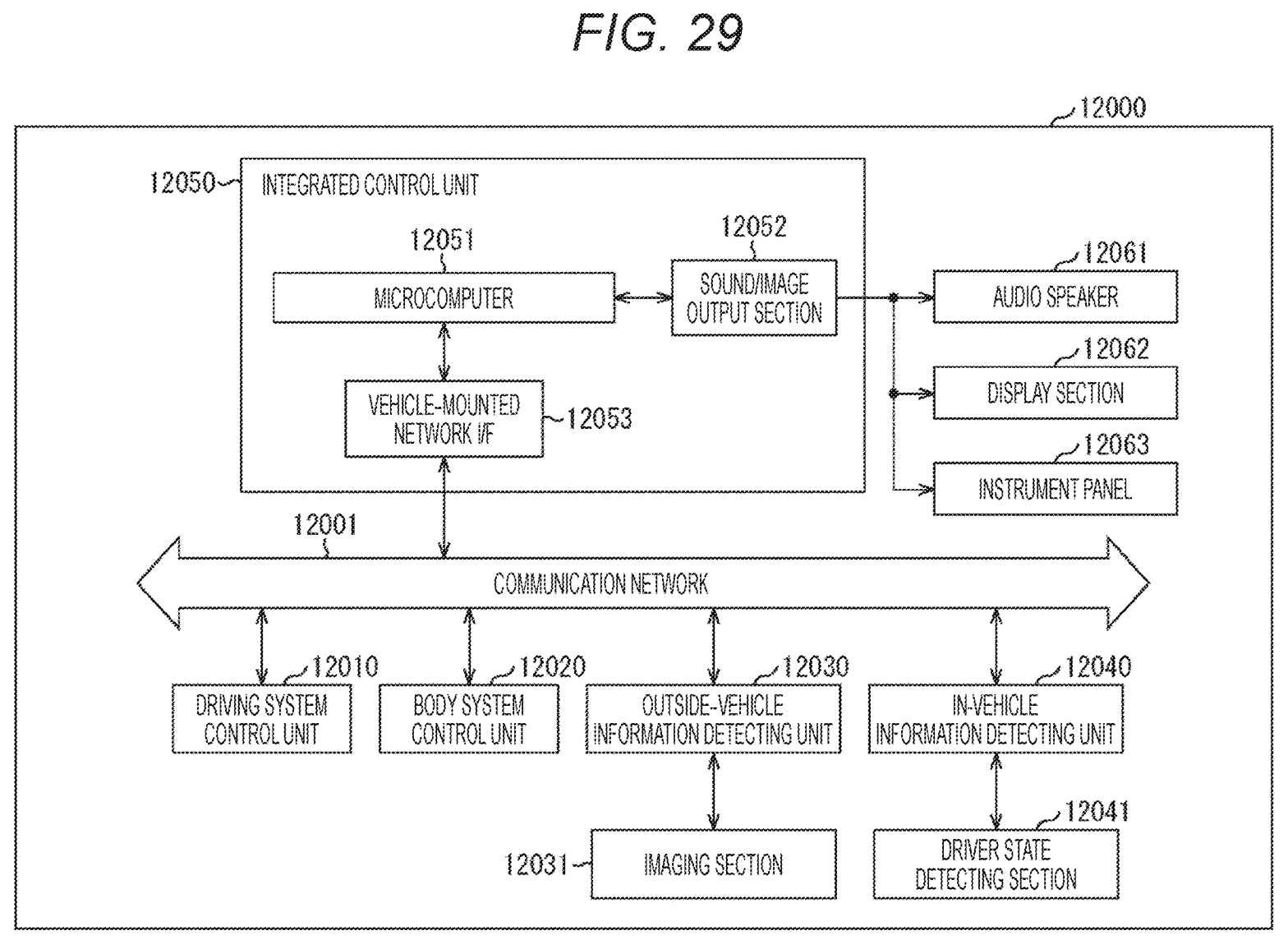

FIG. 29 is a block diagram illustrating a schematic configuration example of a vehicle control system as an example of a mobile body control system to which the technology according to the present disclosure can be applied.

The vehicle control system 12000 includes a plurality of electronic control units connected to each other via a communication network 12001. In the example illustrated in FIG. 29, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of information about the outside of the vehicle, the information being acquired by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 29, an audio speaker 12061, a display section 12062, and an instrument panel 12063 are exemplified as the output device. The display section 12062 may, for example, include at least one of an on-board display and a head-up display.

Figure 30:
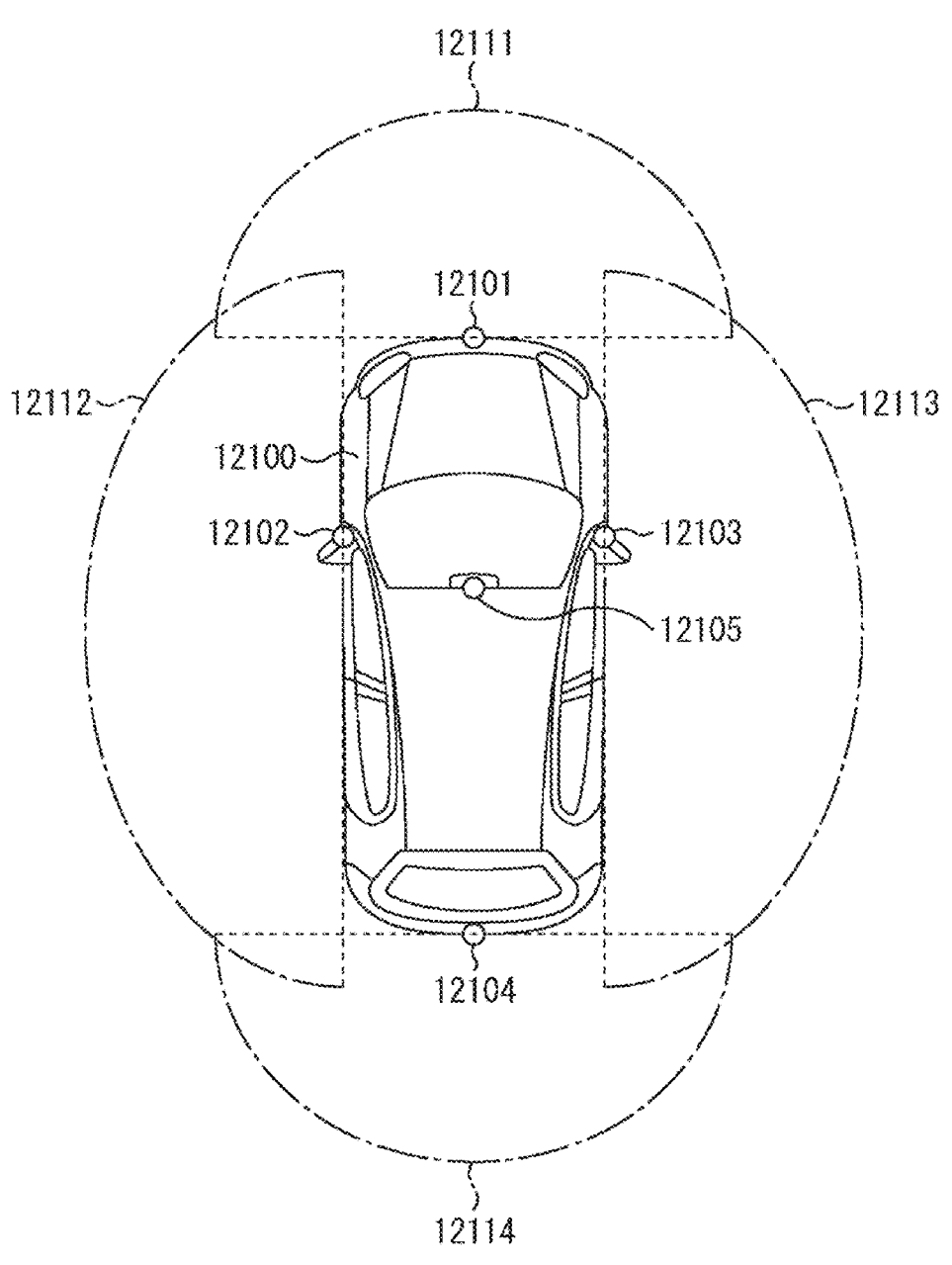
FIG. 30 is an explanatory diagram illustrating an example of installation positions of an outside-vehicle information detection section and imaging sections.

FIG. 30 is a diagram illustrating an example of installation position of the imaging section 12031.

In FIG. 30, the imaging section 12031 includes imaging sections 12101, 12102, 12103, 12104, and 12105.

The imaging sections 12101, 12102, 12103, 12104, and 12105 are provided at positions, for example, a front nose, sideview mirrors, a rear bumper, and a back door of the vehicle 12100, an upper portion of a windshield within the interior of the vehicle, and the like. The imaging section 12101 provided to the front nose and the imaging section 12105 provided to the upper portion of the windshield within the interior of the vehicle obtain mainly an image of the front of the vehicle 12100. The imaging sections 12102 and 12103 provided on the sideview mirrors mainly obtain images of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 30 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure can be applied has been described above. The technology according to the present disclosure can be applied to, for example, the imaging section 12031 among the components described above. Specifically, the semiconductor device 100 in FIG. 1 can be applied to the imaging section 12031. By applying the technology according to the present disclosure to the imaging section 12031, it is possible to reduce thermal stress in the device and improve reliability.

12. Application Example to Endoscopic Surgical System

The technology according to the present disclosure can be applied to various products. For example, the technology according to the present disclosure may be applied to an endoscopic surgical system.

FIG. 31 is a diagram illustrating an example of a schematic configuration of an endoscopic surgical system 5000 to which the technology according to the present disclosure can be applied. FIG. 31 illustrates a state in which an operator (doctor) 5067 performs surgery on a patient 5071 on a patient bed 5069 by using the endoscopic surgical system 5000. As illustrated, the endoscopic surgical system 5000 includes an endoscope 5001, other surgical tools 5017, a support arm device 5027 that supports the endoscope 5001, and a cart 5037 on which various devices for endoscopic surgery are mounted.

In endoscopic surgery, instead of cutting the abdominal wall to open the abdomen, a plurality of tubular opening devices called trocars 5025a to 5025d is introduced through the abdominal wall. Then, a lens tube 5003 of the endoscope 5001 and the other surgical tools 5017 are inserted into the body cavity of the patient 5071 from the trocars 5025a to 5025d. In the illustrated example, an insufflation tube 5019, an energy treatment tool 5021, and forceps 5023 are inserted into the body cavity of the patient 5071 as the other surgical tools 5017. Furthermore, the energy treatment tool 5021 is a treatment tool that performs incision and exfoliation of tissue, sealing of a blood vessel, or the like by high-frequency current and ultrasonic vibration. However, the illustrated surgical tools 5017 are merely examples, and various surgical tools generally used in endoscopic surgery, such as tweezers and a retractor, may be used as the surgical tools 5017.

An image of a surgical site in the body cavity of the patient 5071 captured by the endoscope 5001 is displayed on a display device 5041. The operator 5067 performs a treatment such as resection of an affected site, for example, by using the energy treatment tool 5021 and the forceps 5023 while viewing the image of the surgical site displayed on the display device 5041 in real time. Note that, although not illustrated, the insufflation tube 5019, the energy treatment tool 5021, and the forceps 5023 are supported by the operator 5067, an assistant or the like during the surgery.

(Support Arm Device)

The support arm device 5027 includes an arm 5031 extending from a base 5029. In the illustrated example, the arm 5031 includes joints 5033a, 5033b, and 5033c, and links 5035a and 5035b, and is driven by control from an arm control device 5045. The arm 5031 supports the endoscope 5001 and controls its position and posture. As a result, stable fixation of the position of the endoscope 5001 can be achieved.

(Endoscope)

The endoscope 5001 includes the lens tube 5003 having a region of a predetermined length from a distal end to be inserted into the body cavity of the patient 5071, and a camera head 5005 connected to a proximal end of the lens tube 5003. In the illustrated example, the endoscope 5001 configured as a so-called rigid scope including a rigid lens tube 5003 is illustrated, but the endoscope 5001 may also be configured as a so-called flexible scope including a flexible lens tube 5003.

At the distal end of the lens tube 5003, an opening into which an objective lens is fitted is provided. A light source device 5043 is connected to the endoscope 5001, and light generated by the light source device 5043 is guided to the distal end of the lens tube by a light guide extending inside the lens tube 5003, and emitted to an observation target in the body cavity of the patient 5071 via the objective lens. Note that, the endoscope 5001 may be a forward-viewing endoscope, an oblique-viewing endoscope, or a side-viewing endoscope.

An optical system and an imaging element are provided inside the camera head 5005, and reflected light (observation light) from the observation target is condensed on the imaging element by the optical system. The observation light is photoelectrically converted by the imaging element, and an electric signal corresponding to the observation light, that is, an image signal corresponding to an observation image is generated. The image signal is transmitted as RAW data to a camera control unit (CCU) 5039. Note that, the camera head 5005 has a function of adjusting magnification and focal length by appropriately driving the optical system thereof.

Note that, the camera head 5005 may be provided with a plurality of imaging elements in order to support, for example, stereoscopic viewing (3D display) and the like. In this case, a plurality of relay optical systems is provided inside the lens tube 5003 in order to guide the observation light to each of the plurality of imaging elements.

(Various Devices Mounted on Cart)

The CCU 5039 includes a central processing unit (CPU), a graphics processing unit (GPU) and the like, and comprehensively controls operations of the endoscope 5001 and the display device 5041. Specifically, the CCU 5039 applies, to the image signal received from the camera head 5005, various types of image processing for displaying an image based on the image signal, for example, development processing (demosaic processing) and the like. The CCU 5039 provides the image signal subjected to the image processing to the display device 5041. Furthermore, the CCU 5039 transmits a control signal to the camera head 5005, and controls drive thereof. The control signal can include information regarding imaging conditions such as magnification and focal length.

The display device 5041 displays an image based on the image signal subjected to the image processing by the CCU 5039, by the control from the CCU 5039. In a case where the endoscope 5001 supports high-resolution imaging such as 4K (3840 horizontal pixels×2160 vertical pixels), 8K (7680 horizontal pixels×4320 vertical pixels), or the like, and/or supports 3D display, for example, a device capable of performing high-resolution display and/or a device capable of performing 3D display can be used as the display device 5041, respectively, so as to support them. In a case of supporting the high-resolution imaging of 4K, 8K, or the like, by using the display device 5041 having a size of 55 inches or larger, a more immersive feeling is obtained. Furthermore, a plurality of display devices 5041 having different resolutions and sizes may be provided depending on the application.

The light source device 5043 includes a light source, for example, a light emitting diode (LED) and the like, and supplies the endoscope 5001 with irradiation light when imaging the surgical site.

The arm control device 5045 includes a processor such as a CPU and the like, for example, and operates according to a predetermined program to control drive of the arm 5031 of the support arm device 5027 according to a predetermined control method.

An input device 5047 is an input interface to the endoscopic surgical system 5000. A user can input various types of information and instructions to the endoscopic surgical system 5000 via the input device 5047. For example, the user inputs various types of information regarding the surgery such as physical information of the patient, and information regarding a surgical procedure via the input device 5047. Furthermore, for example, the user inputs an instruction to drive the arm 5031, an instruction to change the imaging condition by the endoscope 5001 (type of irradiation light, magnification, focal length, and the like), an instruction to drive the energy treatment tool 5021, and the like via the input device 5047.

A type of the input device 5047 is not limited, and the input device 5047 may be various known input devices. As the input device 5047, for example, a mouse, a keyboard, a touch panel, a switch, a foot switch 5057, and/or a lever and the like can be applied. In a case where the touch panel is used as the input device 5047, the touch panel may be provided on a display surface of the display device 5041.

Alternatively, the input device 5047 is a device worn by the user, such as an eyeglass-type wearable device, a head mounted display (HMD), and the like, for example, and various inputs are performed in accordance with the user's gesture and line-of-sight detected by these devices. Furthermore, the input device 5047 includes a camera capable of detecting movement of the user, and various inputs are performed in accordance with the user's gesture and line-of-sight detected from a video captured by the camera. Moreover, the input device 5047 includes a microphone capable of collecting the user's voice, and various inputs are performed by voice via the microphone. As described above, the input device 5047 is enabled to input various information without contact, whereby in particular the user (for example, the operator 5067) belonging to a clean area can operate a device belonging to an unclean area without contact. Furthermore, since the user can operate the device without releasing the user's hand from the surgical tool being held, the convenience of the user is improved.

A treatment tool control device 5049 controls drive of the energy treatment tool 5021 for cauterization and incision of tissue, sealing of a blood vessel, or the like. An insufflation device 5051 injects gas into the body cavity via the insufflation tube 5019 to inflate the body cavity of the patient 5071 for the purpose of securing a visual field by the endoscope 5001 and securing a working space of the operator. A recorder 5053 is a device capable of recording various types of information regarding the surgery. A printer 5055 is a device capable of printing various types of information regarding the surgery in various formats such as text, image, or graph.

Hereinafter, a particularly characteristic component in the endoscopic surgical system 5000 is described in further detail.

(Support Arm Device)

The support arm device 5027 includes the base 5029 as a base, and the arm 5031 extending from the base 5029. In the illustrated example, the arm 5031 includes the plurality of joints 5033a, 5033b, and 5033c, and the plurality of links 5035a and 5035b connected together by the joint 5033b, but in FIG. 32, for simplicity, the configuration of the arm 5031 is illustrated in a simplified manner. Actually, shapes, the numbers, and arrangements of the joints 5033a to 5033c and the links 5035a and 5035b, directions of rotational axes of the joints 5033a to 5033c, and the like can be appropriately set so that the arm 5031 has a desired degree of freedom. For example, the arm 5031 can be suitably configured with six or more degrees of freedom. As a result, since it becomes possible to freely move the endoscope 5001 within a range of movement of the arm 5031, the lens tube 5003 of the endoscope 5001 can be inserted into the body cavity of the patient 5071 in a desired direction.

Each of the joints 5033a to 5033c is provided with an actuator, and each of the joints 5033a to 5033c is configured to be rotatable around a predetermined rotational axis by drive of the actuator. The drive of the actuator is controlled by the arm control device 5045, whereby a rotation angle of each of the joints 5033a to 5033c is controlled, and the drive of the arm 5031 is controlled. As a result, the control of the position and posture of the endoscope 5001 can be achieved. At this time, the arm control device 5045 can control the drive of the arm 5031 by various known control methods such as force control or position control.

For example, the operator 5067 appropriately performs an operation input via the input device 5047 (including the foot switch 5057), whereby the drive of the arm 5031 may be appropriately controlled by the arm control device 5045 in accordance with the operation input, and the position and posture of the endoscope 5001 may be controlled. With this control, it is possible to move the endoscope 5001 at a distal end of the arm 5031 from an arbitrary position to an arbitrary position, and thereafter fixedly support the same in the position after movement. Note that, the arm 5031 may be operated by a so-called master-slave method. In this case, the arm 5031 can be remotely operated by the user via the input device 5047 installed at a place away from an operating room.

Furthermore, in a case where the force control is applied, the arm control device 5045 may perform so-called power assist control to receive an external force from the user and drive the actuators of the respective joints 5033a to 5033c so that the arm 5031 moves smoothly according to the external force. As a result, when the user moves the arm 5031 while directly touching the arm 5031, the arm 5031 can be moved with a relatively light force Thus, the endoscope 5001 can be moved more intuitively and by a simpler operation, and the convenience of the user can be improved.

Here, generally, in the endoscopic surgery, the endoscope 5001 is supported by a doctor called a scopist. On the other hand, by using the support arm device 5027, the position of the endoscope 5001 can be more reliably fixed without manual operation, so that the image of the surgical site can be stably obtained and the surgery can be performed smoothly.

Note that the arm control device 5045 does not necessarily have to be provided on the cart 5037. Furthermore, the arm control device 5045 does not necessarily have to be one device. For example, the arm control device 5045 may be provided on each of the joints 5033a to 5033c of the arm 5031 of the support arm device 5027, and a plurality of arm control devices 5045 may cooperate with each other to achieve driving control of the arm 5031.

(Light Source Device)

The light source device 5043 supplies the endoscope 5001 with the irradiation light when the surgical site is imaged.

The light source device 5043 includes, for example, a white light source including an LED, a laser light source, or a combination thereof. At this time, in a case where the white light source includes a combination of R, G, and B laser light sources, the output intensity and the output timing of each color (each wavelength) can be controlled with high accuracy, so that adjustment of the white balance of the captured image can be performed in the light source device 5043. Furthermore, in this case, by irradiating the observation target with the laser light from each of the R, G, and B laser light sources in time division manner and controlling drive of the imaging element of the camera head 5005 in synchronism with irradiation timing, it is possible to capture images corresponding to R, G, and B in time division manner. According to this method, a color image can be obtained even if color filters are not provided for the imaging element.

Furthermore, the drive of the light source device 5043 may be controlled such that the intensity of the light to be output is changed every predetermined time. By controlling the drive of the imaging element of the camera head 5005 in synchronization with the timing of the change of the light intensity to obtain images in a time division manner and combining the images, an image of a high dynamic range without black defect and halation can be generated.

Furthermore, the light source device 5043 may be configured to be able to supply light of a predetermined wavelength band corresponding to special light observation. In the special light observation, for example, by using wavelength dependency of absorption of light in body tissue, by applying light of a narrower band than that of the irradiation light (that is, white light) at ordinary observation, so-called narrow band imaging is performed in which predetermined tissue such as the blood vessel in the mucosal surface layer and the like is imaged with high contrast. Alternatively, in the special light observation, fluorescence observation may be performed that obtains an image by fluorescence generated by emitting excitation light. In the fluorescence observation, it is possible to irradiate a body tissue with excitation light to observe the fluorescence from the body tissue (autofluorescence observation), or to locally inject a reagent such as indocyanine green (ICG) into a body tissue and irradiate the body tissue with excitation light corresponding to the fluorescence wavelength of the reagent to obtain a fluorescent image, for example. The light source device 5043 can be configured to be able to supply narrow band light and/or excitation light for such special light observation.

(Camera Head and CCU)

Figure 32:
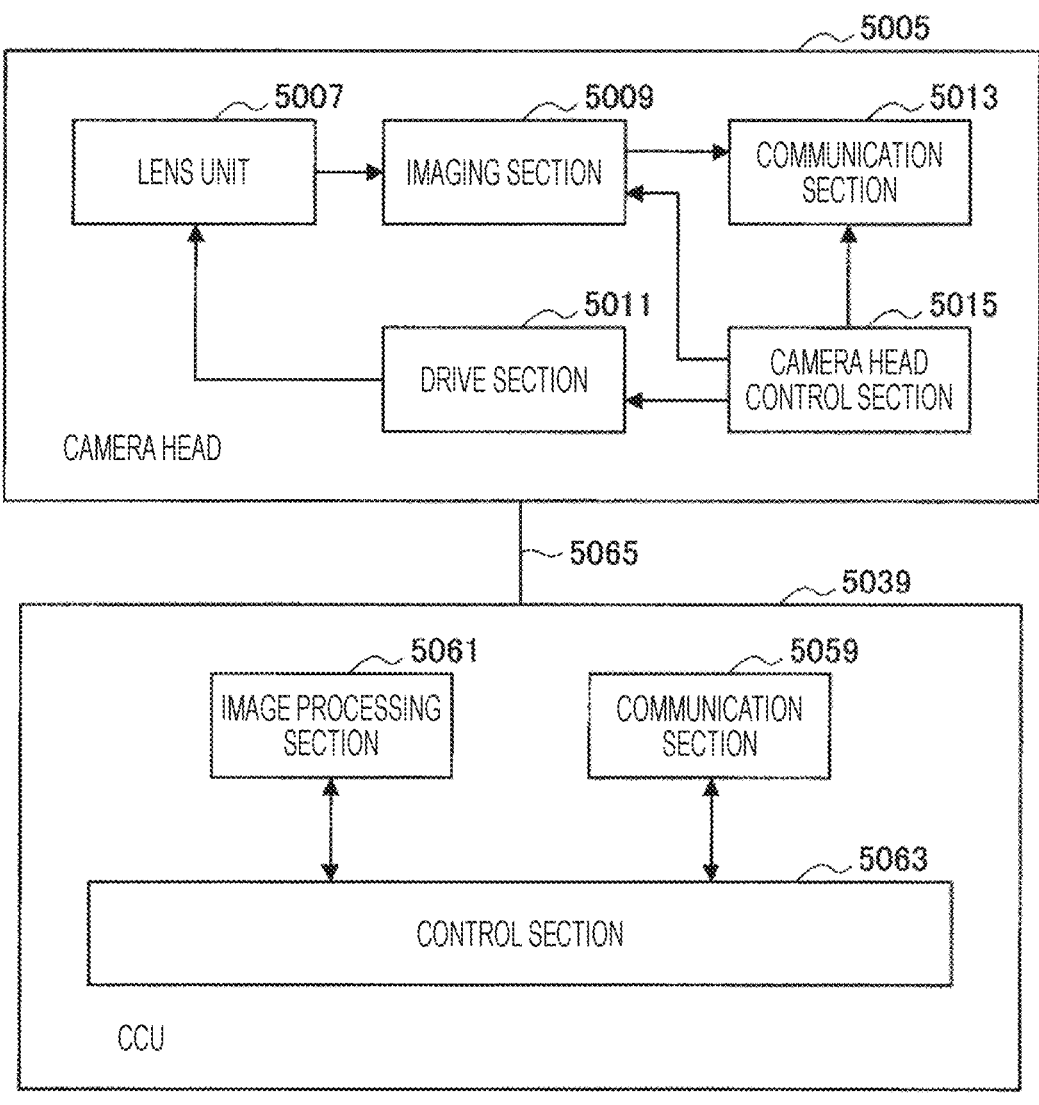
FIG. 32 is a block diagram illustrating an example of functional configurations of a camera head and a CCU illustrated in FIG. 31.

Functions of the camera head 5005 and the CCU 5039 of the endoscope 5001 will be described in more detail with reference to FIG. 32. FIG. 32 is a block diagram illustrating an example of functional configurations of the camera head 5005 and the CCU 5039 illustrated in FIG. 31.

Referring to FIG. 32, the camera head 5005 includes, as its functions, a lens unit 5007, an imaging section 5009, a drive section 5011, a communication section 5013, and a camera head control section 5015. Furthermore, the CCU 5039 includes, as its functions, a communication section 5059, an image processing section 5061, and a control section 5063. The camera head 5005 and the CCU 5039 are communicably connected to each other in both directions by a transmission cable 5065.

First, the functional configuration of the camera head 5005 will be described. The lens unit 5007 is an optical system provided at a connection portion to the lens tube 5003. The observation light taken in from the distal end of the lens tube 5003 is guided to the camera head 5005 and is incident on the lens unit 5007. The lens unit 5007 includes a combination of a plurality of lenses including a zoom lens and a focus lens. An optical characteristic of the lens unit 5007 is adjusted such that the observation light is condensed on a light-receiving surface of the imaging element of the imaging section 5009. Furthermore, positions on the optical axis of the zoom lens and the focus lens are movable to adjust the magnification and focus of a captured image.

The imaging section 5009 includes the imaging element, and is arranged at the subsequent stage of the lens unit 5007. The observation light that passes through the lens unit 5007 is condensed on the light-receiving surface of the imaging element, and an image signal corresponding to an observation image is generated by photoelectric conversion. The image signal generated by the imaging section 5009 is provided to the communication section 5013.

As the imaging element constituting the imaging section 5009, for example, an element is used that is a complementary metal oxide semiconductor (CMOS) type image sensor, and is capable of color imaging having a Bayer array. Note that, as the imaging element, an element may be used compatible with imaging of the high-resolution image of greater than or equal to 4K, for example. The image of the surgical site at high resolution is obtained, whereby the operator 5067 can grasp a state of the surgical site in further detail, and can proceed with the surgery more smoothly.

Furthermore, the imaging element constituting the imaging section 5009 includes a pair of imaging elements for acquiring image signals for the right-eye and left-eye to cope with 3D display. By the 3D display, the operator 5067 can grasp a depth of a living tissue in the surgical site more accurately. Note that, in a case where the imaging section 5009 includes a multi-chip imaging element, a plurality of systems of the lens units 5007 is provided corresponding to respective imaging elements.

Furthermore, the imaging section 5009 does not necessarily have to be provided in the camera head 5005. For example, the imaging section 5009 may be provided inside the lens tube 5003 immediately after the objective lens.

The drive section 5011 includes an actuator and moves the zoom lens and the focus lens of the lens unit 5007 by a predetermined distance along the optical axis by control from the camera head control section 5015. As a result, the magnification and the focus of the captured image by the imaging section 5009 can be appropriately adjusted.

The communication section 5013 includes a communication device for transmitting/receiving various types of information to/from the CCU 5039. The communication section 5013 transmits the image signal obtained from the imaging section 5009 as RAW data to the CCU 5039 via the transmission cable 5065. At this time, to display the captured image of the surgical site with low latency, the image signal is preferably transmitted by optical communication. At the time of surgery, the operator 5067 performs surgery while observing a state of the affected site with the captured image, so that it is required that a moving image of the surgical site is displayed in real time as much as possible for safer and more reliable surgery. In a case where the optical communication is performed, the communication section 5013 is provided with a photoelectric conversion module that converts an electric signal into an optical signal. The image signal is converted into the optical signal by the photoelectric conversion module, and then transmitted to the CCU 5039 via the transmission cable 5065.

Furthermore, the communication section 5013 receives the control signal for controlling the drive of the camera head 5005 from the CCU 5039. The control signal includes, for example, the information regarding the imaging condition such as information specifying a frame rate of the captured image, information specifying an exposure value at the time of imaging, and/or information specifying the magnification and focus of the captured image. The communication section 5013 provides the received control signal to the camera head control section 5015. Note that, the control signal from the CCU 5039 may also be transmitted by optical communication. In this case, the communication section 5013 is provided with a photoelectric conversion module that converts an optical signal into an electric signal, and the control signal is converted into an electric signal by the photoelectric conversion module and then provided to the camera head control section 5015.

Note that, the above-described imaging conditions such as the frame rate, the exposure value, the magnification, and the focus are automatically set by the control section 5063 of the CCU 5039 on the basis of the image signal acquired. That is, a so-called auto exposure (AE) function, auto-focus (AF) function, and auto white balance (AWB) function are installed in the endoscope 5001.

The camera head control section 5015 controls the drive of the camera head 5005 on the basis of the control signal from the CCU 5039 received via the communication section 5013. For example, the camera head control section 5015 controls the drive of the imaging element of the imaging section 5009 on the basis of the information specifying the frame rate of the captured image and/or the information specifying the exposure at the time of imaging. Furthermore, for example, the camera head control section 5015 appropriately moves the zoom lens and focus lens of the lens unit 5007 with the drive section 5011 on the basis of the information specifying the magnification and focus of the captured image. The camera head control section 5015 may further have a function of storing information for identifying the lens tube 5003 and the camera head 5005.

Note that, the camera head 5005 can be made to have resistance to autoclave sterilization by arranging components such as the lens unit 5007 and the imaging section 5009 in a sealed structure with high airtightness and waterproofness.

Next, the functional configuration of the CCU 5039 will be described. The communication section 5059 includes a communication device for transmitting/receiving various types of information to/from the camera head 5005. The communication section 5059 receives the image signal transmitted from the camera head 5005 via the transmission cable 5065. At this time, as described above, the image signal can be suitably transmitted by optical communication. In this case, to be adaptable to optical communication, the communication section 5059 is provided with a photoelectric conversion module that converts an optical signal into an electric signal. The communication section 5059 provides the image signal converted into the electric signal to the image processing section 5061.

Furthermore, the communication section 5059 transmits the control signal for controlling the drive of the camera head 5005 to the camera head 5005. The control signal may also be transmitted by optical communication.

The image processing section 5061 performs various types of image processing on the image signal that is RAW data transmitted from the camera head 5005. The image processing includes various types of known signal processing, for example, development processing, image quality enhancement processing (such as band enhancement processing, super-resolution processing, noise reduction (NR)

processing and/or camera shake correction processing), and/or enlargement processing (electronic zoom processing), and the like. Furthermore, the image processing section 5061 performs detection processing on the image signal for performing AE, AF, and AWB.

The image processing section 5061 includes a processor such as a CPU or GPU, and the image processing and detection processing described above can be performed by the processor operating in accordance with a predetermined program. Note that, in a case where the image processing section 5061 includes a plurality of GPUs, the image processing section 5061 appropriately divides information related to the image signal and performs the image processing in parallel by the plurality of GPUs.

The control section 5063 performs various controls regarding imaging of the surgical site by the endoscope 5001 and display of the captured image. For example, the control section 5063 generates the control signal for controlling the drive of the camera head 5005. At this time, in a case where the imaging condition is input by the user, the control section 5063 generates the control signal on the basis of the input by the user. Alternatively, in a case where the AE function, the AF function, and the AWB function are installed in the endoscope 5001, the control section 5063 generates the control signal by appropriately calculating the optimum exposure value, focal length, and white balance depending on a result of the detection processing by the image processing section 5061.

Furthermore, the control section 5063 causes the display device 5041 to display the image of the surgical site on the basis of the image signal subjected to the image processing by the image processing section 5061. At this time, the control section 5063 recognizes various objects in the surgical site image by using various image recognition technologies. For example, the control section 5063 detects a shape, a color, and the like of an edge of an object included in the surgical site image, thereby being able to recognize a surgical tool such as forceps, a specific living-body site, bleeding, mist at the time of use of the energy treatment tool 5021, and the like. When causing the display device 5041 to display the image of the surgical site, the control section 5063 causes various types of surgery assistance information to be superimposed and displayed on the image of the surgical site by using a result of the recognition. The surgery assistance information is superimposed and displayed, and presented to the operator 5067, whereby the surgery can be performed more safely and reliably.

The transmission cable 5065 connecting the camera head 5005 and the CCU 5039 together is an electric signal cable adaptable to communication of electric signals, an optical fiber adaptable to optical communication, or a composite cable thereof.

Here, in the illustrated example, communication is performed by wire using the transmission cable 5065, but communication between the camera head 5005 and the CCU 5039 may be performed wirelessly. In a case where the communication between the both is performed wirelessly, it is not necessary to lay the transmission cable 5065 in the operating room, so that a situation in which movement of medical staffs in the operating room is hindered by the transmission cable 5065 can be solved.

The example of the endoscopic surgical system 5000 to which the technology according to the present disclosure can be applied has been described above. Note that, here, the endoscopic surgical system 5000 is described as an example, but a system to which the technology according to the present disclosure can be applied is not limited to such an example. For example, the technology according to the present disclosure may be applied to a flexible endoscope system for examination or a microscopic surgery system.

The technology according to the present disclosure can be suitably applied to the imaging section 5009 among the components described above. Specifically, the semiconductor device 100 of FIG. 1 can be applied to the imaging section 5009. By applying the technology according to the present disclosure to the imaging section 5009, it is possible to reduce thermal stress in the device and improve reliability.

Note that, the embodiments described above each describe an example for embodying the present technology, and matters in the embodiments and matters specifying the invention in the claims have correspondence relationships. Similarly, the matters specifying the invention in the claims and the matters in the embodiments of the present technology denoted by the same names have correspondence relationships. However, the present technology is not limited to the embodiments, and can be embodied by subjecting the embodiments to various modifications without departing from the gist thereof.

Note that, the advantageous effects described in the specification are merely examples, and the advantageous effects of the present technology are not limited to them and may include other effects.

Note that the present technology may also have a following configuration.

(1) A semiconductor device including:
  a semiconductor substrate;
  a wiring layer formed on a front surface of the semiconductor substrate;
  a first through hole that penetrates the semiconductor substrate from a back surface to the front surface of the semiconductor substrate, and has a side wall covered with an insulating film; and
  a first inner through electrode formed along a part of the side wall of the first through hole.

(2) The semiconductor device according to (1), further including
  a second through hole that penetrates the semiconductor substrate from the back surface to the front surface of the semiconductor substrate, and has a side wall covered with an insulating film; and
  a second inner through electrode formed along the side wall of the second through hole, in which
  an area where the second inner through electrode is formed is different from an area where the first inner through electrode is formed.

(3) The semiconductor device according to (1) or (2), further including
  an outer through electrode formed between the semiconductor substrate and the insulating film.

(4) The semiconductor device according to any of (1) to (3), further including
  an external terminal formed on the back surface; and
  a back surface wiring line having one end connected to the external terminal and another end connected to the first inner through electrode.

(5) The semiconductor device according to (4), in which
  a predetermined number of semiconductor elements is arranged in the wiring layer,
  a specific semiconductor element among the predetermined number of semiconductor elements is closest to the first through hole, and
  the first inner through electrode is disposed at a position closest to the specific semiconductor element in the first through hole.

(6) The semiconductor device according to (4), in which
 a predetermined number of semiconductor elements is
  arranged in the wiring layer,
 a specific semiconductor element among the predeter-
  mined number of semiconductor elements is closest
  to the first through hole, and
 the first inner through electrode is disposed at a position
  farthest from the specific semiconductor element in
  the first through hole.
(7) The semiconductor device according to any of (1) to
 (6), in which
 the first inner through electrode is formed at each of a
  plurality of places of the side wall of the first through
  hole.
(8) The semiconductor device according to (7), in which
 potentials of the first inner through electrodes at the
  plurality of places are identical to each other.
(9) The semiconductor device according to (7), in which
 potentials of the first through electrodes at the plurality
  of places are different from each other.
(10) The semiconductor device according to any of (1) to
 (9), further including
 a back surface wiring line connected to the first inner
  through electrode, in which
 the first inner through electrode and the back surface
  wiring line are different from each other in at least
  one of a line width or a thickness.
(11) The semiconductor device according to any of (1) to
 (10), in which
 a shape of the through hole is an ellipse when viewed
  from a direction perpendicular to the back surface,
  and the first inner through electrode is formed on a
  minor axis of the ellipse.
(12) The semiconductor device according to any of (1) to
 (11), in which
 the first inner through electrode is formed along a part
  of the side wall and a part of a bottom portion of the
  first through hole.
(13) The semiconductor device according to (12), in
 which
 a pad is formed along a part of the bottom portion in the
  wiring layer.
(14) The semiconductor device according to any of (1) to
 (13), in which
 the first inner through electrode is formed in a portion
  other than a slit.
(15) The semiconductor device according to any of (1) to
 (14), in which
 the insulating film covers a part of the side wall of the
  through hole, and
 the first inner through electrode is formed along the
  side wall covered with the insulating film.
(16) The semiconductor device according to (15), further
 including
 an inorganic film that covers the side wall of the
  through hole, in which
 the insulating film covers a part of the inorganic film.
(17) The semiconductor device according to (15) or (16),
 in which
 the insulating film covers a plurality of regions of the
  side wall of the through hole.
(18) The semiconductor device according to any of (15)
 to (17), in which
 an area of a portion covered with the insulating film of
  the side wall is different from an area of a portion not
  covered with the insulating film.

(19) A method for manufacturing a semiconductor device
 including:
 a wiring layer forming procedure of forming a wiring
  layer on a front surface of a semiconductor substrate;
 a through hole forming procedure of forming a first
  through hole that penetrates the semiconductor sub-
  strate from a back surface to the front surface of the
  semiconductor substrate;
 an insulating film forming procedure of forming an
  insulating film that covers a side wall of the first
  through hole; and
 an inner through electrode forming procedure of form-
  ing a first inner through electrode along a part of the
  side wall of the first through hole.
(20) The method for manufacturing according to (19), in
 which
 in the through electrode forming procedure, the through
  electrode is formed by a semi-additive method.

REFERENCE SIGNS LIST

11 Lower substrate
12 Upper substrate
13 Laminated substrate
21 Pixel region
22 Control circuit
23 Logic circuit
100 Semiconductor device
110 Protective film
120, 120-1 to 120-3, 121 Bump
130 to 132 Through hole
140, 150 Conductive film
141, 141-1 to 141-3, 143, 151 Through electrode
142, 142-1 to 142-3, 144, 152 Back surface wiring line
160 Insulating film
165 Inorganic film
170 Semiconductor substrate
180 Wiring layer
181 Pad
182 Front surface wiring line
183 Transistor
190 Resist
5009, 12031 Imaging section

What is claimed is:
1. A semiconductor device, comprising:
a semiconductor substrate;
a wiring layer formed on a front surface of the semicon-
 ductor substrate;
a first through hole that penetrates the semiconductor
 substrate from a back surface to the front surface of the
 semiconductor substrate, and has a side wall covered
 with an insulating film;
a first inner through electrode formed along a part of the
 side wall of the first through hole;
an external terminal formed on the back surface; and
a back surface wiring line having one end connected to the
 external terminal and another end connected to the first
 inner through electrode.
2. The semiconductor device according to claim 1, further
comprising
a second through hole that penetrates the semiconductor
 substrate from the back surface to the front surface of
 the semiconductor substrate, and has a side wall cov-
 ered with an insulating film; and
a second inner through electrode formed along the side
 wall of the second through hole, wherein an area where the second inner through electrode is formed is different from an area where the first inner through electrode is formed.

3. The semiconductor device according to claim 1, further comprising an outer through electrode formed between the semiconductor substrate and the insulating film.

4. The semiconductor device according to claim 1, wherein a predetermined number of semiconductor elements is arranged in the wiring layer, a specific semiconductor element among the predetermined number of semiconductor elements is closest to the first through hole, and the first inner through electrode is disposed at a position closest to the specific semiconductor element in the first through hole.

5. The semiconductor device according to claim 1, wherein a predetermined number of semiconductor elements is arranged in the wiring layer, a specific semiconductor element among the predetermined number of semiconductor elements is closest to the first through hole, and the first inner through electrode is disposed at a position farthest from the specific semiconductor element in the first through hole.

6. The semiconductor device according to claim 1, further comprising a back surface wiring line connected to the first inner through electrode, wherein the first inner through electrode and the back surface wiring line are different from each other in at least one of a line width or a thickness.

7. The semiconductor device according to claim 1, wherein the first inner through electrode is formed along a part of the side wall and a part of a bottom portion of the first through hole.

8. The semiconductor device according to claim 7, wherein a pad is formed along a part of the bottom portion in the wiring layer.

9. The semiconductor device according to claim 1, wherein the first inner through electrode is formed in a portion other than a slit.

10. The semiconductor device according to claim 1, wherein the insulating film covers a part of the side wall of the through hole, and the first inner through electrode is formed along the side wall covered with the insulating film.

11. The semiconductor device according to claim 10, further comprising an inorganic film that covers the side wall of the through hole, wherein the insulating film covers a part of the inorganic film.

12. The semiconductor device according to claim 10, wherein the insulating film covers a plurality of regions of the side wall of the through hole.

13. The semiconductor device according to claim 10, wherein an area of a portion covered with the insulating film of the side wall is different from an area of a portion not covered with the insulating film.

14. A semiconductor device, comprising:

a semiconductor substrate;

a wiring layer formed on a front surface of the semiconductor substrate;

a first through hole that penetrates the semiconductor substrate from a back surface to the front surface of the semiconductor substrate, and has a side wall covered with an insulating film; and a first inner through electrode formed along a part of the side wall of the first through hole, wherein-the first inner through electrode is formed at each of a plurality of places of the side wall of the first through hole.

15. The semiconductor device according to claim 14, wherein potentials of the first inner through electrodes at the plurality of places are identical to each other.

16. The semiconductor device according to claim 14, wherein potentials of the first through electrodes at the plurality of places are different from each other.

17. The semiconductor device according to claim 14, further comprising a second through hole that penetrates the semiconductor substrate from the back surface to the front surface of the semiconductor substrate, and has a side wall covered with an insulating film; and a second inner through electrode formed along the side wall of the second through hole, wherein an area where the second inner through electrode is formed is different from an area where the first inner through electrode is formed.

18. The semiconductor device according to claim 14, further comprising an outer through electrode formed between the semiconductor substrate and the insulating film.

19. The semiconductor device according to claim 14, further comprising an external terminal formed on the back surface; and a back surface wiring line having one end connected to the external terminal and another end connected to the first inner through electrode.

20. A semiconductor device, comprising:

a semiconductor substrate;

a wiring layer formed on a front surface of the semiconductor substrate;

a first through hole that penetrates the semiconductor substrate from a back surface to the front surface of the semiconductor substrate, and has a side wall covered with an insulating film; and a first inner through electrode formed along a part of the side wall of the first through hole, wherein a shape of the through hole is an ellipse when viewed from a direction perpendicular to the back surface, and the first inner through electrode is formed on a minor axis of the ellipse.

* * * * *